United States Patent
Yamaguchi et al.

(12)

(10) Patent No.: US 6,436,792 B1
(45) Date of Patent: Aug. 20, 2002

(54) METHOD OF MANUFACTURING SEMICONDUCTOR DEVICE

(75) Inventors: Yasuo Yamaguchi; Shigenobu Maeda; Yuuichi Hirano, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/325,644

(22) Filed: Jun. 4, 1999

(30) Foreign Application Priority Data

Jan. 14, 1999 (JP) .......................................... 11-007759

(51) Int. Cl.$^7$ ............................................... H01L 21/76
(52) U.S. Cl. ........................ 438/432; 438/311; 438/287
(58) Field of Search .................................. 438/432, 311, 438/446, 287; 257/347, 351, 304, 401, 201, 409; 357/23.7

(56) References Cited

U.S. PATENT DOCUMENTS

| | | | | | |
|---|---|---|---|---|---|
| 5,125,007 A | * | 6/1992 | Yamaguchi | ................ | 357/23.7 |
| 5,355,012 A | * | 10/1994 | Yamaguchi | ................ | 257/409 |
| 6,087,230 A | * | 7/2000 | Byung | ................ | 438/287 |
| 6,140,195 A | * | 10/2000 | Byung | ................ | 438/311 |
| 6,171,930 B1 | * | 1/2001 | Lee | ................ | 438/432 |
| 6,171,931 B1 | * | 1/2001 | Chan | ................ | 438/432 |
| 6,255,704 B1 | * | 7/2001 | Iwata | ................ | 257/401 |

* cited by examiner

*Primary Examiner*—John F. Niebling
*Assistant Examiner*—Andre' Stevenson
(74) *Attorney, Agent, or Firm*—Oblon, Spivak, McClelland, Maier & Neustadt, P.C.

(57) ABSTRACT

A silicon oxide film (6*aa*) is formed on an upper surface of an SOI layer (3), a silicon nitride film (6*bb*) is formed on the silicon oxide film (6*aa*), and a silicon oxide film (6*cc*) is formed on the silicon nitride film (6*bb*). Using the silicon nitride film (6*bb*) as an etch stopper, anisotropic dry etching is performed on the silicon oxide film (6*cc*) in first and second device formation regions. Then, using the silicon oxide film (6*aa*) as an etch stopper, anisotropic dry etching is performed on the silicon nitride film (6*bb*) in the first and second device formation regions. The silicon oxide film (6*aa*) in the first and second device formation regions is removed by wet etching using hydrofluoric acid to expose the upper surface of the SOI layer (3). A method of manufacturing a semiconductor device is provided which is capable of avoiding the formation of a damaged layer in a main surface of an SOI substrate when such a device isolation structure is formed.

16 Claims, 22 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of forming a device isolation structure in a semiconductor device employing an SOI (Silicon On Insulator) substrate.

2. Description of the Background Art

FIG. 44 is a cross-sectional view of a background art semiconductor device employing an SOI substrate. The SOI substrate which includes a silicon substrate 101, a buried oxide film 102 and an SOI layer 103 has first and second device formation regions and a device isolation region. In each of the first and second device formation regions, a multilayer structure including a gate oxide film 104 and a gate electrode 105 formed on the gate oxide film 104 is selectively formed on an upper surface of the SOI layer 103. In the device isolation region, an isolation oxide film 106 is formed on the upper surface of the SOI layer 103.

The structure of the semiconductor device shown in FIG. 44 is described in detail hereinafter using an instance where an N-channel MOS transistor is formed in each of the first and second device formation regions. A channel formation region 107 doped with a p-type impurity of a concentration of, for example, $1 \times 10^{17}$ to $1 \times 10^{18}/cm^3$ is formed under each of the gate electrodes 105 in the SOI layer 103. A well region 109 doped with a p-type impurity of a concentration of, for example, $1 \times 10^{17}$ to $5 \times 10^{18}/cm^3$ is formed under the isolation oxide film 106 in the SOI layer 103. A body region 110 doped with a p-type impurity of a concentration of, for example, $1 \times 10^{19}$ to $1 \times 10^{21}/cm^3$ is selectively formed in the well region 109. A source/drain region 108 doped with an n-type impurity of a concentration of, for example, $1 \times 10^{19}$ to $1 \times 10^{21}/cm^3$ is formed between each of the channel formation regions 107 and the well region 109 in the SOI layer 103.

An interlayer insulation film 111 is formed entirely on the SOI layer 103. Contact holes 112 are selectively formed extending through the interlayer insulation film 111 from an upper surface of the interlayer insulation film 111 to the upper surface of the SOI layer 103 where the source/drain regions 108 are formed. A contact hole 114 is formed extending through the interlayer insulation film 111 and the isolation oxide film 106 from the upper surface of the interlayer insulation film 111 to the upper surface of the SOI layer 103 where the body region 110 is formed. The contact holes 112 and 114 are filled with a conductor.

A source/drain electrode 113 is formed on the upper surface of the interlayer insulation film 111 where each of the contact holes 112 is formed. The conductor which fills the contact holes 112 establishes electric connections between the source/drain electrodes 113 and the source/drain regions 108. A substrate electrode 115 is formed on the upper surface of the interlayer insulation film 111 where the contact hole 114 is formed. The conductor which fills the contact hole 114 establishes an electric connection between the substrate electrode 115 and the body region 110.

A method of forming the isolation oxide film 106 in the semiconductor device shown in FIG. 44 is described hereinafter. FIGS. 45 through 47 are cross-sectional views showing the background art method of forming the isolation oxide film 106 in order of process steps. Initially, a silicon oxide film 120 is formed by the CVD process and the like on the upper surface of the SOI layer 103 in which the channel formation regions 107 and the well region 109 are formed (FIG. 45). Then, a photoresist 121 is formed on the silicon oxide film 120 in the device isolation region by the photolithographic technique (FIG. 46). Using the photoresist 121 as a mask, anisotropic dry etching such as RIE (Reactive Ion Etching) which exhibits a higher etch rate in a direction of the depth of the SOI substrate is performed on the silicon oxide film 120 to expose the upper surface of the SOI layer 103. An unetched part of the silicon oxide film 120 serves as the isolation oxide film 106. Thereafter, the photoresist 121 is removed (FIG. 47).

Such a background art method of forming the isolation oxide film is disadvantageous in that the dry etching is performed until the SOI layer 103 is exposed for the formation of the isolation oxide film 106 to form a damaged layer 123 containing defects 122 in the upper surface of the SOI layer 103 in the first and second device formation regions. Since heavy metals and the like are prone to accumulate in the damaged layer 123 and the SOI substrate includes the buried oxide film between the SOI layer and the silicon substrate, the SOI substrate is more difficult to recover from the damage to the SOI layer by heat treatment and the like than a CZ substrate and an FZ substrate. Thus, the gate oxide film 104 formed on the SOI layer 103 having the damaged layer 123 is decreased in reliability.

SUMMARY OF THE INVENTION

A first aspect of the present invention is intended for a method of forming a device isolation structure for providing electrical isolation between first and second semiconductor devices formed respectively in first and second device formation regions of an SOI substrate, the device isolation structure being formed on a device isolation region between the first and second device formation regions of the SOI substrate. According to the present invention, the method comprises the steps of: (a) forming at least a first insulation film and a first film in stacked relation in the order named on a main surface of the SOI substrate; (b) removing the first film in the first and second device formation regions; and (c) removing the first insulation film in the first and second device formation regions by wet etching.

Preferably, according to a second aspect of the present invention, in the method of the first aspect, the first film includes a second insulation film different in material from the first insulation film; and the first film is removed by anisotropic dry etching which exhibits a higher etch rate in a direction of the depth of the SOI substrate in the step (b).

Preferably, according to a third aspect of the present invention, in the method of the second aspect, the first insulation film is a silicon oxide film, and the second insulation film is a silicon nitride film.

Preferably, according to a fourth aspect of the present invention, in the method of the first aspect, the first film includes a conductive film, and the step (a) comprises the step of forming a second insulation film on the first film. The method further comprises the step of (d) forming a third insulation film at a side surface of the first film, the step (d) being performed after the step (c).

Preferably, according to a fifth aspect of the present invention, in the method of the fourth aspect, the conductive film is a polysilicon film doped with an impurity, and the step (d) comprises the steps of: (d-1) thermally oxidizing a surface of a resultant structure provided in the step (c); and (d-2) removing a thermal oxide film formed in the step (d-1)

by the thermal oxidation of the main surface of the SOI substrate in the first and second device formation regions.

Preferably, according to a sixth aspect of the present invention, the method of the fifth aspect further comprises the step of (e) forming a sidewall including a fourth insulation film on respective side surfaces of the first insulation film, the first film and the second insulation film, the step (e) being performed after the step (d).

Preferably, according to a seventh aspect of the present invention, in the method of the sixth aspect, the step (e) comprises the steps of: (e-1) forming a fifth insulation film on a resultant structure provided in the step (d); (e-2) forming a sixth insulation film on the fifth insulation film; (e-3) performing anisotropic dry etching which exhibits a higher etch rate in a direction of the depth of the SOI substrate on the sixth insulation film by using the fifth insulation film as an etch stopper; and (e-4) removing the fifth insulation film exposed in the step (e-3) by wet etching.

Preferably, according to an eighth aspect of the present invention, the method of any one of the fourth to seventh aspects further comprises the step of (f) exposing the first film to ultraviolet light after all manufacturing steps using plasma.

A ninth aspect of the present invention is intended for a method of forming a device isolation structure for providing electrical isolation between first and second semiconductor devices formed respectively in first and second device formation regions of an SOI substrate, the device isolation structure being formed on a device isolation region between the first and second device formation regions of the SOI substrate. According to the present invention, the method comprises the steps of: (a) forming a first insulation film on a main surface of the SOI substrate; (b) removing the first insulation film in the first and second device formation regions by anisotropic dry etching which exhibits a higher etch rate in a direction of the depth of the SOI substrate; (c) thermally oxidizing the main surface of the SOI substrate exposed in the step (b) to form a thermal oxide film; and (d) removing the thermal oxide film.

Preferably, according to a tenth aspect of the present invention, the method of the ninth aspect further comprises the step of (e) forming a sidewall including a second insulation film on a side surface of the first insulation film in the device isolation region, the step (e) being performed after the step (d).

Preferably, according to an eleventh aspect of the present invention, in the method of the tenth aspect, the step (e) comprises the steps of: (e-1) forming a third insulation film on a resultant structure provided in the step (d); (e-2) forming a fourth insulation film on the third insulation film; (e-3) performing anisotropic dry etching which exhibits a higher etch rate in a direction of the depth of the SOI substrate on the fourth insulation film by using the third insulation film as an etch stopper; and (e-4) removing the third insulation film exposed in the step (e-3) by wet etching.

A twelfth aspect of the present invention is intended for a method of forming a device isolation structure for providing electrical isolation between first and second semiconductor devices formed respectively in first and second device formation regions of an SOI substrate, the device isolation structure being formed on a device isolation region between the first and second device formation regions of the SOI substrate. According to the present invention, the method comprises the steps of: (a) forming a first film on a main surface of the SOI substrate; (b) removing the first film in the device isolation region to form a recessed part; (c) filling the recessed part with a second film serving as an insulation film; and (d) removing the first film in the first and second device formation regions by wet etching.

According to a thirteenth aspect of the present invention, a semiconductor device comprises: an SOI substrate; and a device isolation structure including a first insulation film, a conductive film and a second insulation film which are arranged in stacked relation in the order named on a device isolation region of the SOI substrate.

Preferably, according to a fourteenth aspect of the present invention, in the semiconductor device of the thirteenth aspect, the device isolation structure includes a thermal oxide film on a side surface of the conductive film.

Preferably, according to a fifteenth aspect of the present invention, in the semiconductor device of the thirteenth aspect, the device isolation structure further includes a sidewall including a third insulation film and formed on respective side surfaces of the first insulation film, the conductive film and the second insulation film.

In accordance with the first aspect of the present invention, the first insulation film is removed by the wet etching to expose the main surface of the SOI substrate in the first and second device formation regions in the step (c). Therefore, the formation of a damaged layer in the main surface of the SOI substrate is avoided when the device isolation structure is formed.

In accordance with the second aspect of the present invention, the first film is removed by the anisotropic dry etching, and only the first insulation film is removed by the wet etching which is isotropic. Therefore, the first film which is relatively thick is formed on the first insulation film which is relative thin in the step (a), whereby the device isolation structure is generally of an anisotropically etched configuration.

In accordance with the third aspect of the present invention, the anisotropic dry etching in the step (b) is performed on condition that the etch rate of the silicon nitride film is higher than that of the silicon oxide film, to allow the removal of the silicon nitride film only.

In accordance with the fourth aspect of the present invention, since the device isolation structure has the conductive film formed therein, a capacitor may be formed between the device isolation structure and the SOI substrate to enhance the isolation performance of the device isolation structure. Additionally, the first to third insulation films can provide electrical isolation between the conductive film and the SOI substrate.

In accordance with the fifth aspect of the present invention, the thermal oxidation in the step (d-1) accelerates the oxidation of the polysilicon film doped with the impurity. Then, when the thermal oxide film is removed in the step (d-2), the thermal oxide film formed in the side surface of the polysilicon film by the accelerated oxidation is left to serve as the third insulation film. Additionally, since the thermal oxide film is also formed in the main surface of the SOI substrate in the first and second device formation regions, the removal of the thermal oxide film in the step (d-2) allows the SOI substrate in the first and second device formation regions to be thinner than that in the device isolation region.

In accordance with the sixth aspect of the present invention, the formation of the sidewall may reduce the difference in level of the main surface of the SOI substrate on a boundary between the first and second device formation regions and the device isolation region which arises from the removal of the thermal oxide film. This suppresses the generation of a parasitic MOS transistor resulting from the level difference.

In accordance with the seventh aspect of the present invention, the fifth insulation film is removed by the wet etching to expose the main surface of the SOI substrate in the step (e-4). Therefore, the formation of a damaged layer in the surface of the SOI substrate is avoided when the sidewall is formed.

In accordance with the eighth aspect of the present invention, exposing the first film to ultraviolet light causes electric charges introduced in the first film in the manufacturing steps using plasma to be discharged.

In accordance with the ninth aspect of the present invention, the thermal oxide film is also formed in the main surface of the SOI substrate in the step (c). If a damaged layer is formed in the main surface of the SOI substrate by the anisotropic dry etching in the step (b), the removal of the thermal oxide film in the step (d) also removes the damaged layer.

In accordance with the tenth aspect of the present invention, the formation of the sidewall may reduce the difference in level of the main surface of the SOI substrate on a boundary between the first and second device formation regions and the device isolation region which arises from the removal of the thermal oxide film. This suppresses the generation of a parasitic MOS transistor resulting from the level difference.

In accordance with the eleventh aspect of the present invention, the third insulation film is removed by the wet etching to expose the main surface of the SOI substrate in the step (e-4). Therefore, the formation of a damaged layer in the surface of the SOI substrate is avoided when the sidewall is formed.

In accordance with the twelfth aspect of the present invention, the first film in the first and second device formation regions is removed by the wet etching in the step (d) to expose the main surface of the SOI substrate. Therefore, the formation of a damaged layer in the main surface of the SOI substrate is avoided when the device isolation structure including the second film is formed.

In accordance with the thirteenth aspect of the present invention, since the device isolation structure has the conductive film formed therein, a capacitor may be formed between the device isolation structure and the SOI substrate to enhance the isolation performance of the device isolation structure.

In accordance with the fourteenth aspect of the present invention, the first and second insulation films and the thermal oxide film can provide electrical isolation between the conductive film and the SOI substrate.

In accordance with the fifteenth aspect of the present invention, the first and second insulation films and the sidewall can provide electrical isolation between the conductive film and the SOI substrate.

It is therefore an object of the present invention to provide a method of manufacturing a semiconductor device which is capable of avoiding the formation of a damaged layer in a main surface of an SOI substrate when an isolating insulation film is formed on the main surface of the SOI substrate in a device isolation region, thereby to improve the reliability of a gate insulation film formed thereafter.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
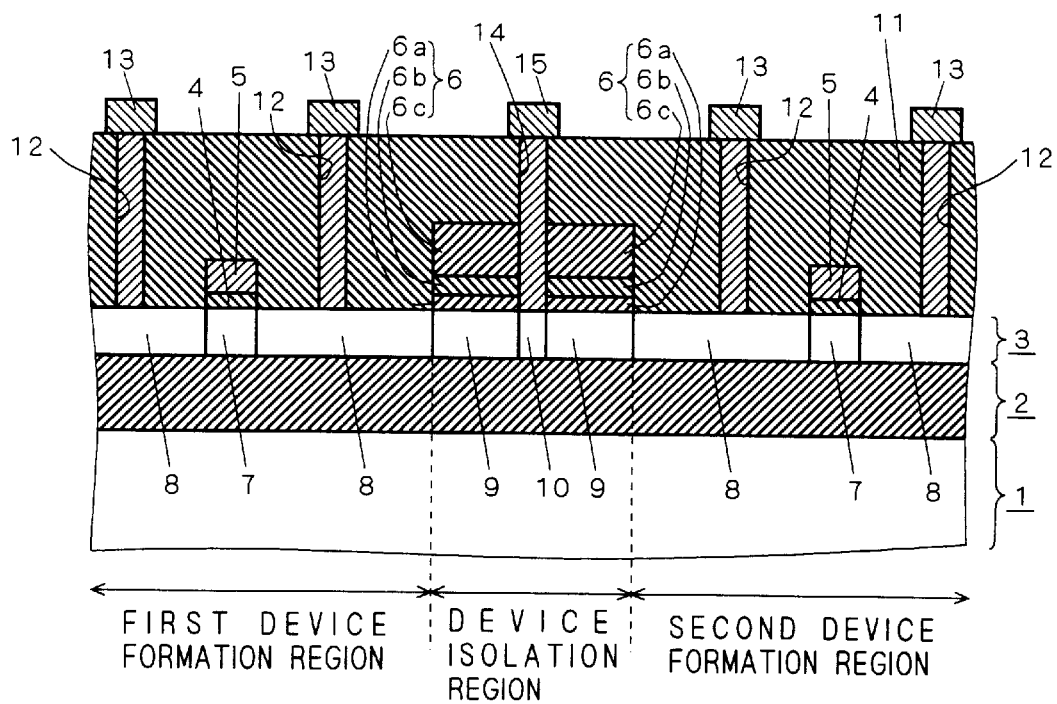
FIG. 1 is a cross-sectional view of a semiconductor device according to a first preferred embodiment of the present invention.

FIG. 1 is a cross-sectional view of a semiconductor device employing an SOI substrate according to a first preferred embodiment of the present invention. The SOI substrate which includes a silicon substrate 1, a buried oxide film 2 having a thickness of 100 to 500 nm, and an SOI layer 3 having a thickness of 30 to 200 nm has first and second device formation regions and a device isolation region. In each of the first and second device formation regions, a multilayer structure including a gate oxide film 4 and a gate electrode 5 formed on the gate oxide film 4 is selectively formed on an upper surface of the SOI layer 3. In the device isolation region, an isolating insulation film 6 including a silicon oxide film 6a, a silicon nitride film 6b formed on the silicon oxide film 6a, and a silicon oxide film 6c formed on the silicon nitride film 6b is formed on the upper surface of the SOI layer 103.

The structure of the semiconductor device shown in FIG. 1 is described in detail hereinafter using an instance where an N-channel MOS transistor is formed in each of the first and second device formation regions. A channel formation region 7 doped with a p-type impurity of a concentration of, for example, $1\times10^{17}$ to $1\times10^{18}/\text{cm}^3$ is formed under each of the gate electrodes 5 in the SOI layer 3. A well region 9 doped with a p-type impurity of a concentration of, for example, $1\times10^{17}$ to $5\times10^{18}/\text{cm}^3$ is formed under the isolating insulation film 6 in the SOI layer 3. In general, the impurity concentration of the well region 9 should be equal to or higher than that of the channel formation regions 7. The higher the impurity concentration of the well region 9 is, the higher a punchthrough phenomenon preventing effect and, accordingly, isolation performance are. A body region 10 doped with a p-type impurity of a concentration of, for example, $1\times10^{19}$ to $1\times10^{21}/\text{cm}^3$ is selectively formed in the well region 9. A source/drain region 8 doped with an n-type impurity of a concentration of, for example, $1\times10^{19}$ to $1\times10^{21}/\text{cm}^3$ is formed between each of the channel formation regions 7 and the well region 9 in the SOI layer 3.

An interlayer insulation film 11 is formed entirely on the SOI layer 3. Contact holes 12 are selectively formed extending through the interlayer insulation film 11 from an upper surface of the interlayer insulation film 11 to the upper surface of the SOI layer 3 where the source/drain regions 8 are formed. A contact hole 14 is formed extending through the interlayer insulation film 11 and the isolating insulation film 6 from the upper surface of the interlayer insulation film 11 to the upper surface of the SOI layer 3 where the body region 10 is formed. The contact holes 12 and 14 are filled with a conductor.

A source/drain electrode 13 is formed on the upper surface of the interlayer insulation film 11 where each of the contact holes 12 is formed. The conductor which fills the contact holes 12 establishes electric connections between the source/drain electrodes 13 and the source/drain regions 8. A substrate electrode 15 is formed on the upper surface of the interlayer insulation film 11 where the contact hole 14 is formed. The conductor which fill the contact hole 14 establishes an electric connection between the substrate electrode 15 and the body region 10. During device operation, a predetermined potential is applied from the substrate electrode 15 to the body region 10 to fix the substrate potential of the SOI substrate. This avoids the accumulation of carriers generated by the impact ionization phenomenon in the channel formation regions 7 to prevent the carriers from inducing the floating-substrate effect, such as the kink effect and the degradation of operating breakdown voltage, thereby accomplishing stable device operation.

Figure 2:
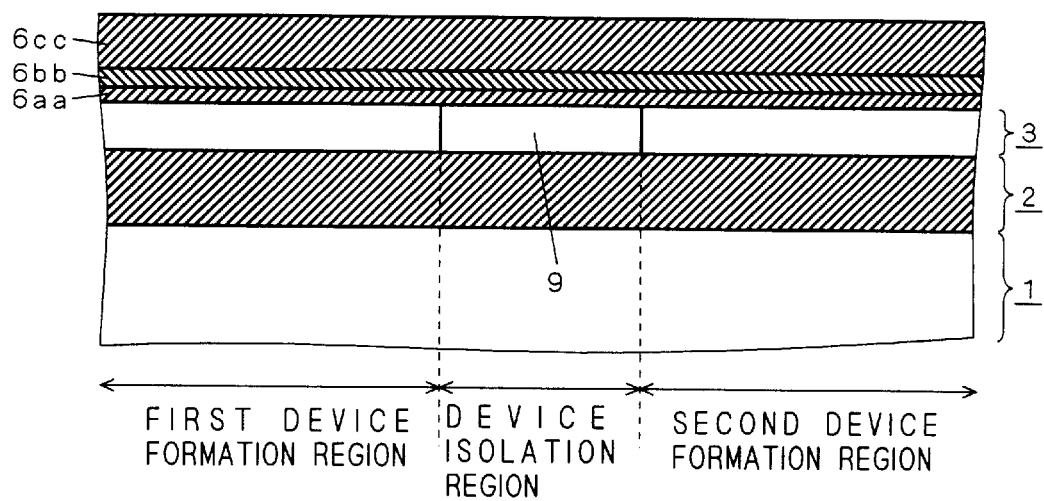
FIGS. 2 through 6 are cross-sectional views showing a method of forming an isolating insulation film in order of process steps according to the first preferred embodiment of the present invention.

A method of forming the isolating insulation film 6 in the semiconductor device shown in FIG. 1 will now be described. FIGS. 2 through 6 are cross-sectional views showing the method of forming the isolating insulation film 6 in order of process steps according to the first preferred embodiment. Initially, a silicon oxide film 6aa having a thickness of 10 to 50 nm is formed by the thermal oxidation or CVD process and the like on the upper surface of the SOI layer 3 in which the channel formation regions 7 and the well region 9 are formed. Next, a silicon nitride film 6bb having a thickness of 10 to 50 nm is formed on an upper surface of the silicon oxide film 6aa by the CVD process and the like. Then, a silicon oxide film 6cc having a thickness of 50 to 200 nm is formed on an upper surface of the silicon nitride film 6bb by the CVD process and the like (FIG. 2).

Figure 3:
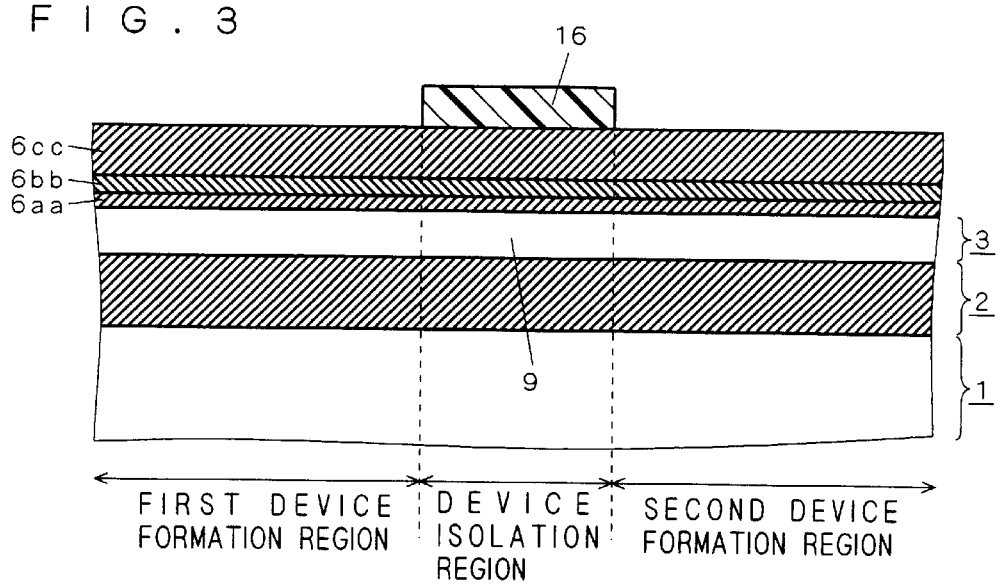
Figure 4:
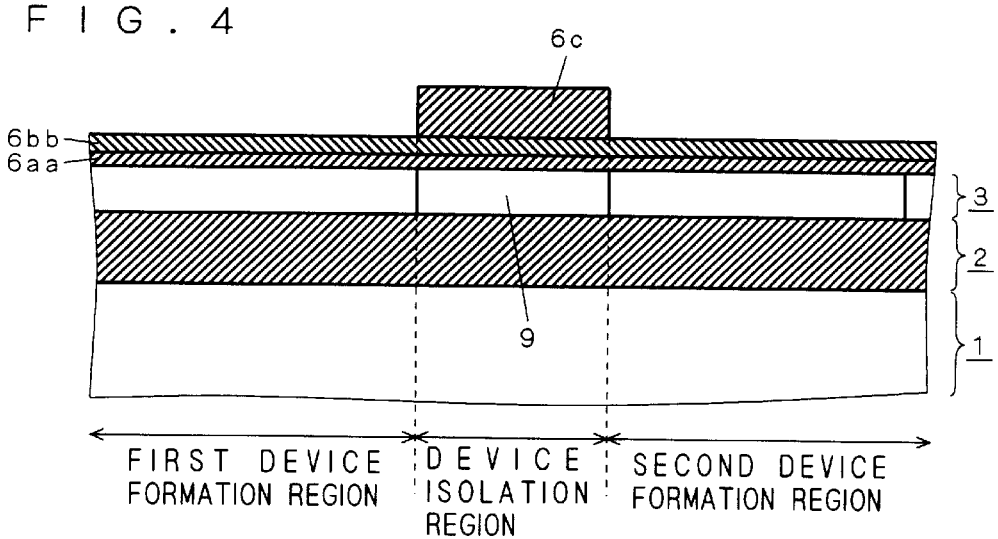

A photoresist 16 is formed on an upper surface of the silicon oxide film 6cc in the device isolation region by the photolithographic technique (FIG. 3). Using the photoresist 16 as a mask, anisotropic dry etching which exhibits a higher etch rate in a direction of the depth of the SOI substrate is performed on the silicon oxide film 6cc in the first and second device formation regions to expose the upper surface of the silicon nitride film 6bb. Specifically, this etching is performed on the silicon oxide film 6cc on condition that the etch rate of the silicon oxide film is higher than that of the silicon nitride film, and is stopped when the upper surface of the silicon nitride film 6bb is exposed. This is equivalent to the etching of the silicon oxide film 6cc using the silicon nitride film 6bb as an etch stopper. Thereafter, the photoresist 16 is removed. This provides the silicon oxide film 6c formed on the upper surface of the silicon nitride film 6bb in the device isolation region (FIG. 4).

Figure 5:
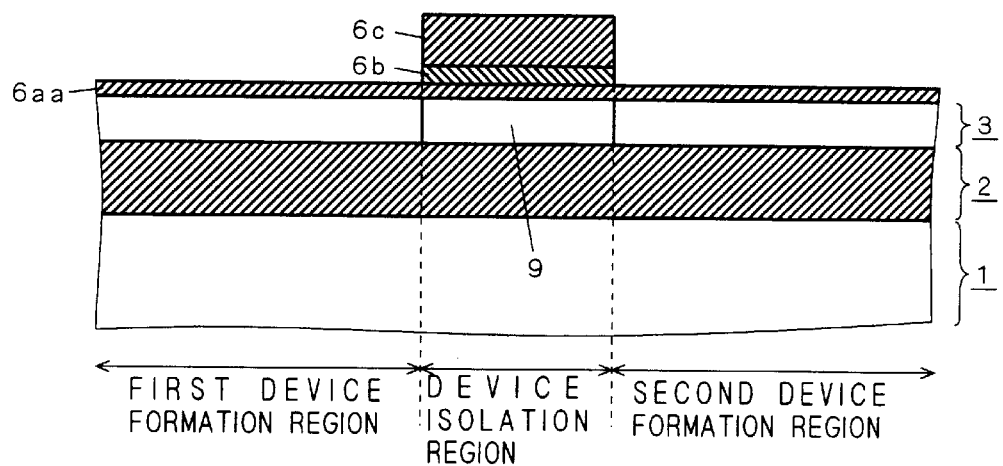

Using the silicon oxide film 6c as a mask, anisotropic dry etching which exhibits a higher etch rate in a direction of the depth of the SOI substrate is performed on the silicon nitride film 6bb in the first and second device formation regions to expose the upper surface of the silicon oxide film 6aa. Specifically, this etching is performed on the silicon nitride film 6bb on condition that the etch rate of the silicon nitride film is higher than that of the silicon oxide film, and is stopped when the upper surface of the silicon oxide film 6aa is exposed. This is equivalent to the etching of the silicon nitride film 6bb using the silicon oxide film 6aa as an etch stopper. In place of the above-described anisotropic dry etching process, a wet etching process using phosphoric acid and the like may be performed to remove the silicon nitride film 6bb in the first and second device formation regions. This provides the silicon nitride film 6b formed on the upper surface of the silicon oxide film 6aa in the device isolation region (FIG. 5).

Figure 6:
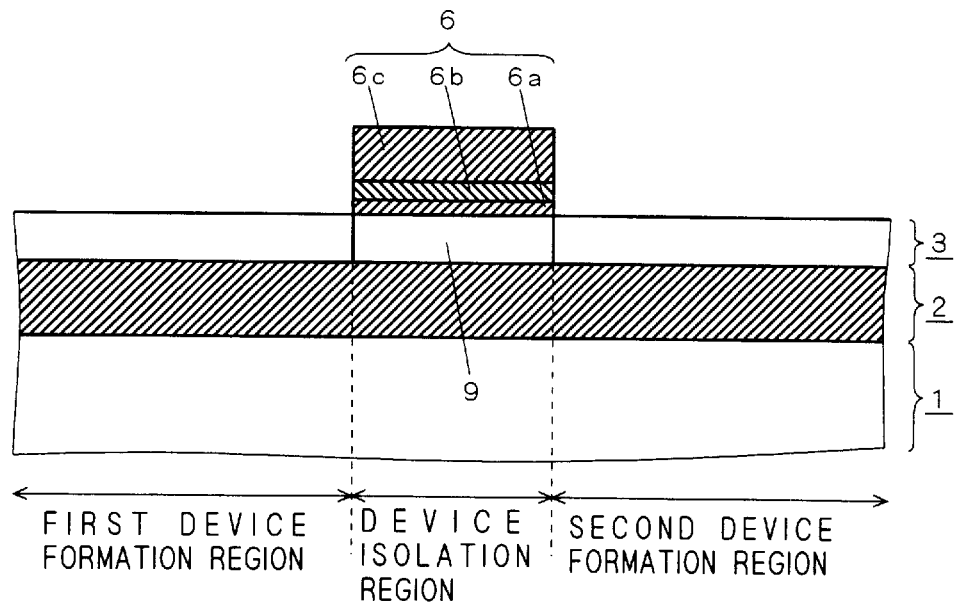

The silicon oxide film 6aa in the first and second device formation regions is removed by wet etching using hydrofluoric acid and the like to expose the upper surface of the SOI layer 3. This provides the silicon oxide film 6a formed on the upper surface of the SOI layer 3 in the device isolation region (FIG. 6). The above-described process steps provide the isolating insulation film 6 including the silicon oxide film 6a, the silicon nitride film 6b and the silicon oxide film 6c which are arranged in stacked relation in the order named on the upper surface of the SOI layer 3 in the device isolation region.

Thus, for the formation of the isolating insulation film 6 in the method of manufacturing the semiconductor device according to the first preferred embodiment, the etching of the silicon nitride film 6bb in the first and second device formation regions is stopped when the silicon oxide film 6aa is exposed, and thereafter the silicon oxide film 6aa in the first and second device formation regions is removed by the wet etching process which does not damage the SOI layer 3, to expose the upper surface of the SOI layer 3. Therefore, the formation of a damaged layer in the upper surface of the SOI layer 3 is avoided when the isolating insulation film 6 is formed.

Figure 7:
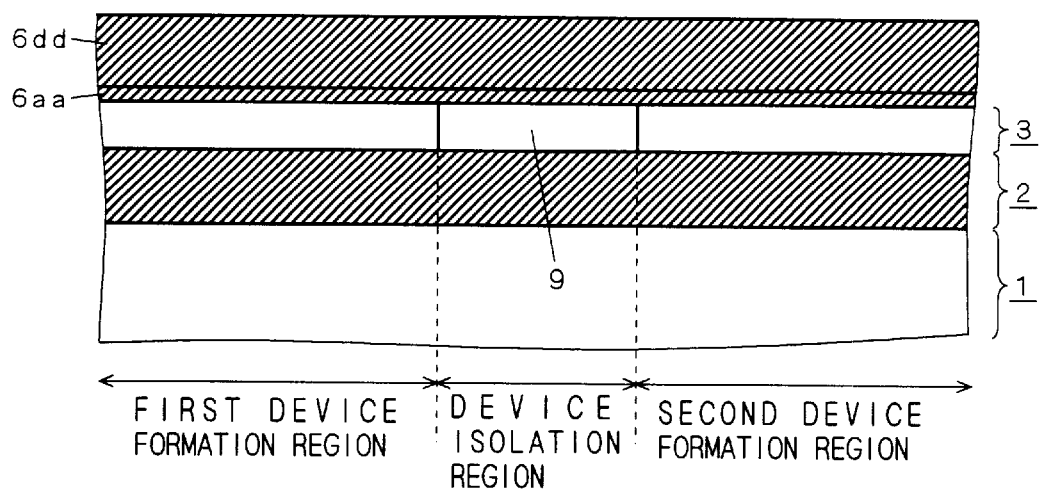
FIGS. 7 through 10 are cross-sectional views showing another method of forming the isolating insulation film in order of process steps according to the first preferred embodiment of the present invention.

Although the isolating insulation film 6 having a three-layer structure including the silicon oxide film 6a, the silicon nitride film 6b and the silicon oxide film 6c is described hereinabove, the silicon oxide film 6c which is a topmost layer of the isolating insulation film 6 need not always be formed. FIGS. 7 through 10 are cross-sectional views showing another method of forming the isolating insulation film 6 in order of process steps according to the first preferred embodiment. Initially, the silicon oxide film 6aa having a thickness of 10 to 50 nm is formed by the thermal oxidation or CVD process and the like on the upper surface of the SOI layer 3 in which the channel formation regions 7 and the well region 9 are formed. Next, a silicon nitride film 6dd having a thickness of 50 to 200 nm is formed on the upper surface of the silicon oxide film 6aa by the CVD process and the like (FIG. 7).

Figure 8:
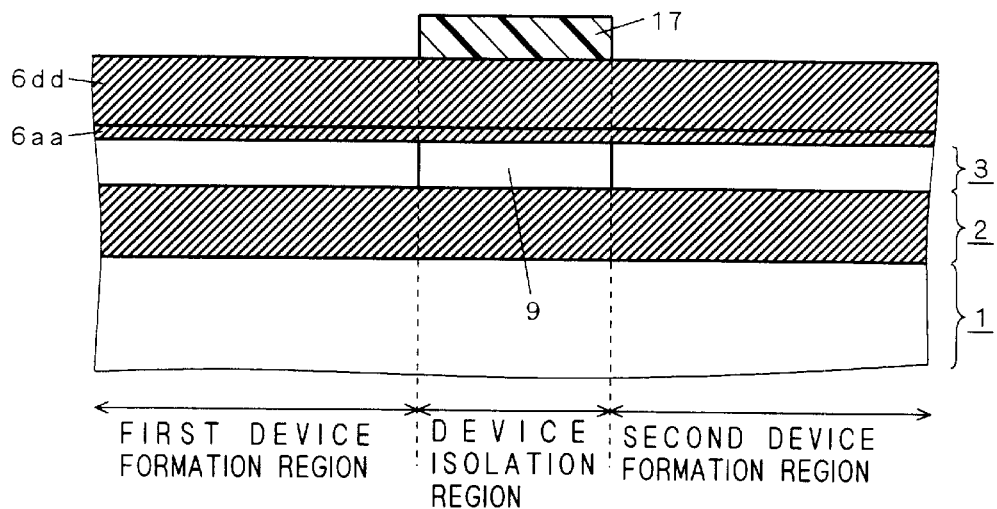
Figure 9:
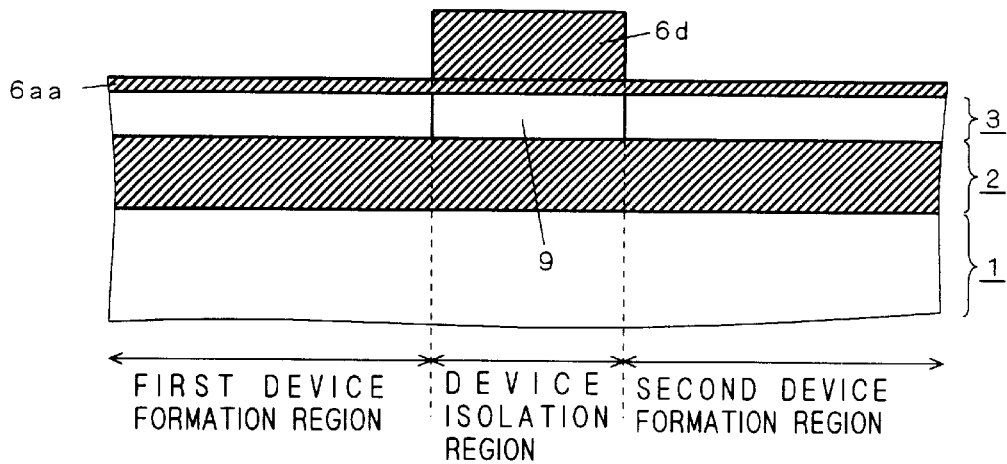

A photoresist 17 is formed on an upper surface of the silicon nitride film 6dd in the device isolation region by the photolithographic technique (FIG. 8). Using the photoresist 17 as a mask, anisotropic dry etching which exhibits a higher etch rate in a direction of the depth of the SOI substrate is performed on the silicon nitride film 6dd in the first and second device formation regions to expose the upper surface of the silicon oxide film 6aa. In other words, this etching is performed on the silicon nitride film 6dd using the silicon oxide film 6aa as an etch stopper. Thereafter, the photoresist 17 is removed. This provides a silicon nitride film 6d formed on the upper surface of the silicon oxide film 6aa in the device isolation region (FIG. 9).

Figure 10:
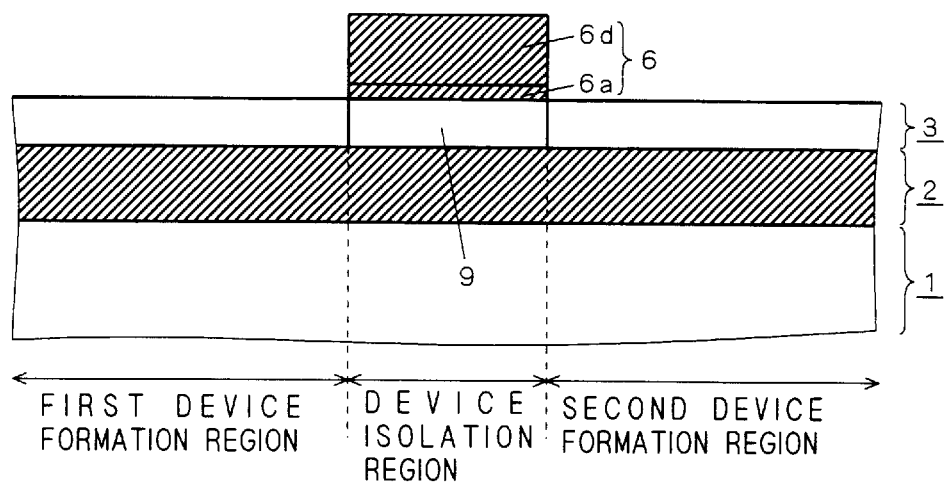

The silicon oxide film 6aa in the first and second device formation regions is removed by wet etching using hydrofluoric acid and the like to expose the upper surface of the SOI layer 3. This provides the silicon oxide film 6a formed on the upper surface of the SOI layer 3 in the device isolation region (FIG. 10). The above-described process steps provide the isolating insulation film 6 having a two-layer structure including the silicon oxide film 6a and the silicon nitride film 6d which are arranged in stacked relation in the order named on the upper surface of the SOI layer 3 in the device isolation region. Similar to the process steps of forming the isolating insulation film 6 having the three-layer structure, the above-described process steps may also avoid the formation of a damaged layer in the upper surface of the SOI layer 3 when the isolating insulation film 6 is formed.

In summary, the formation of the damaged layer in the upper surface of the SOI layer 3 may be avoided by forming at least a first insulation film and a second insulation film which are arranged in stacked relation in the order named on the SOI layer 3, etching the second insulation film in a device formation region using the first insulation film as an etch stopper, and then removing the first insulation film in the device formation region by wet etching. The first and second insulation films used herein may be any insulation film such as a silicon oxide film and a silicon nitride film. However, if the SOI layer 3 is made of silicon, it is desirable to use a silicon oxide film as the first insulation film formed on the upper surface of the SOI layer, 3 in consideration for affinity with silicon.

Second Preferred Embodiment

Figure 11:
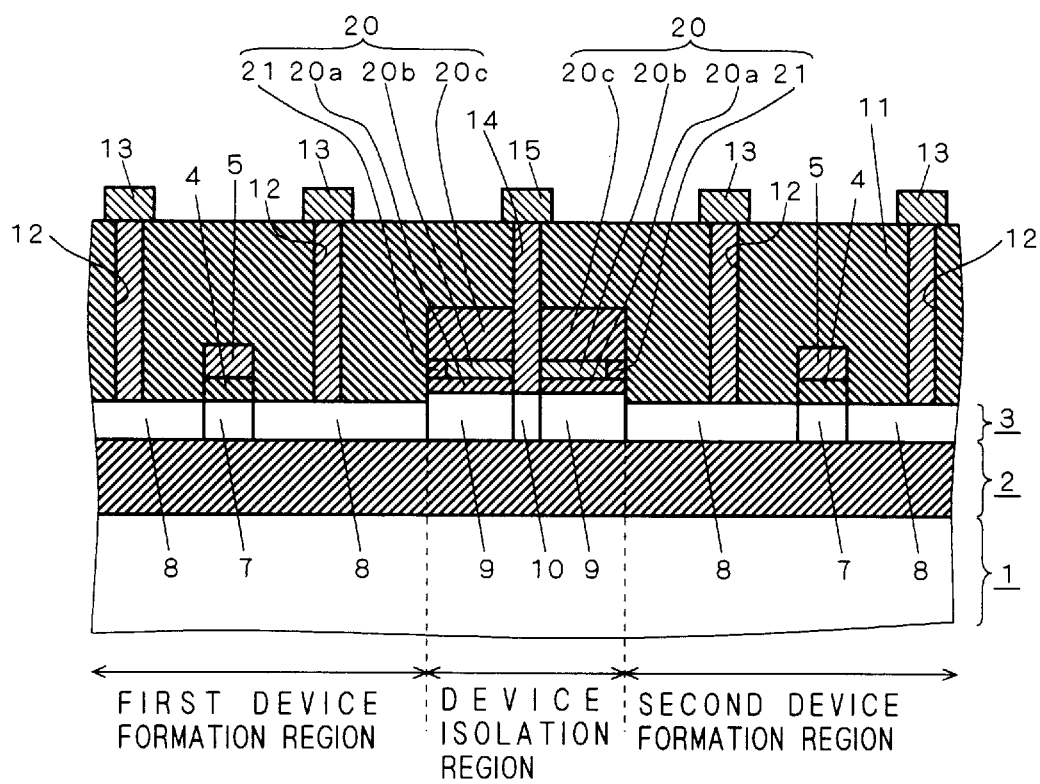
FIG. 11 is a cross-sectional view of the semiconductor device according to a second preferred embodiment of the present invention.

FIG. 11 is a cross-sectional view of the semiconductor device employing the SOI substrate according to a second preferred embodiment of the present invention. The semiconductor device of FIG. 11 comprises an isolation structure 20 in place of the isolating insulation film 6 shown in FIG. 1. The isolation structure 20 comprises a multilayer structure including a silicon oxide film 20a, a polysilicon film 20b formed on the silicon oxide film 20a and a silicon oxide film 20c formed on the polysilicon film 20b, and silicon oxide films 21 formed in respective side surfaces of the polysilicon film 20b. The SOI layer 3 in the first and second device formation regions is thinner than that in the device isolation region. The remaining structure of the semiconductor device according to the second preferred embodiment is similar to that of the semiconductor device of FIG. 1 according to the first preferred embodiment.

Figure 12:
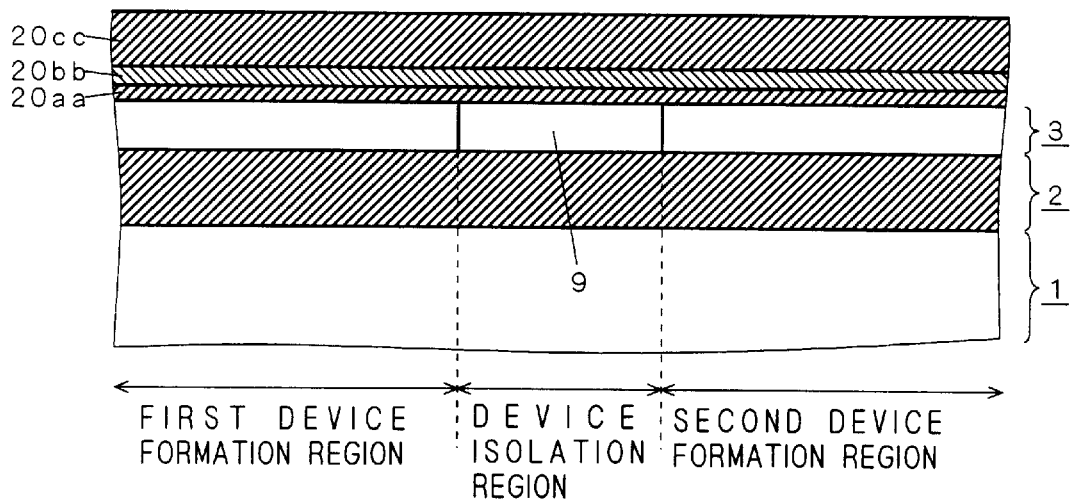
FIGS. 12 through 18 are cross-sectional views showing a method of forming an isolation structure in order of process steps according to the second preferred embodiment of the present invention.

A method of forming the isolation structure 20 in the semiconductor device shown in FIG. 11 will now be described. FIGS. 12 through 18 are cross-sectional views showing the method of forming the isolation structure 20 in order of process steps according to the second preferred embodiment. Initially, a silicon oxide film 20aa having a thickness of 10 to 50 nm is formed by the thermal oxidation or CVD process and the like on the upper surface of the SOI layer 3 in which the channel formation regions 7 and the well region 9 are formed. Next, a polysilicon film 20bb having a thickness of 10 to 50 nm is formed on an upper surface of the silicon oxide film 20aa by the CVD process and the like. The polysilicon film 20bb is implanted with an impurity such as phosphorus and boron. Then, a silicon oxide film 20cc having a thickness of 50 to 200 nm is formed on an upper surface of the polysilicon film 20bb by the CVD process and the like (FIG. 12).

Figure 13:
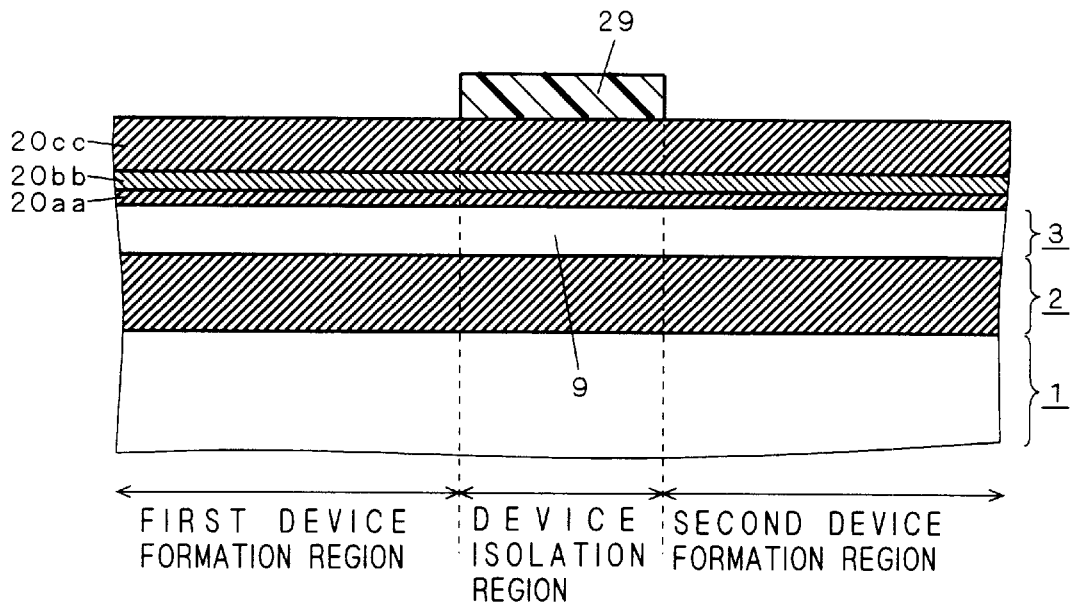
Figure 14:
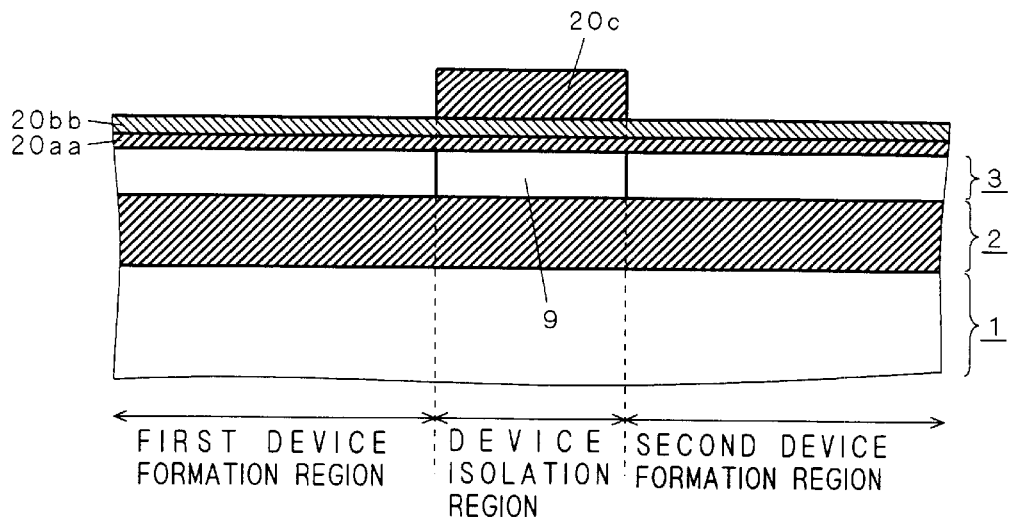

A photoresist 29 is formed on an upper surface of the silicon oxide film 20cc in the device isolation region by the photolithographic technique (FIG. 13). Using the photoresist 29 as a mask, anisotropic dry etching which exhibits a higher etch rate in a direction of the depth of the SOI substrate is performed on the silicon oxide film 20cc in the first and second device formation regions to expose the upper surface of the polysilicon film 20bb. In other words, this etching is performed on the silicon oxide film 20cc using the polysilicon film 20bb as an etch stopper. Thereafter, the photoresist 29 is removed. This provides the silicon oxide film 20c formed on the upper surface of the polysilicon film 20bb in the device isolation region (FIG. 14).

Figure 15:
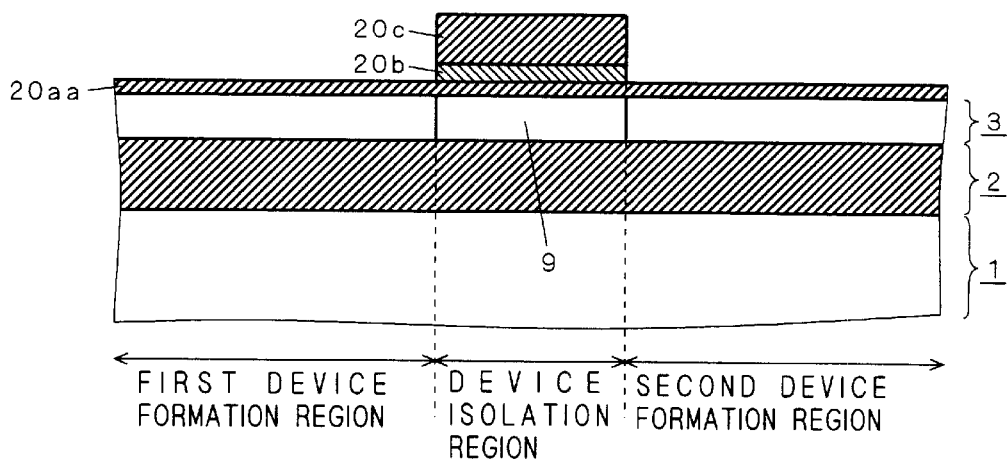

Using the silicon oxide film 20c as a mask, anisotropic dry etching which exhibits a higher etch rate in a direction of the depth of the SOI substrate is performed on the polysilicon film 20bb in the first and second device formation regions to expose the upper surface of the silicon oxide film 20aa. In other words, this etching is performed on the polysilicon film 20bb using the silicon oxide film 20aa as an etch stopper. In place of the above-described anisotropic dry etching process, a wet etching process using hydrofluoric acid, nitric acid and the like may be performed to remove the polysilicon film 20bb in the first and second device formation regions. This provides the polysilicon film 20b formed on the upper surface of the silicon oxide film 20aa in the device isolation region (FIG. 15).

Next, wet etching using hydrofluoric acid and the like is performed on the silicon oxide film 20aa in the first and second device formation regions to expose the upper surface of the SOI layer 3. This provides the silicon oxide film 20a formed on the upper surface of the SOI layer 3 in the device isolation region (FIG. 16).

Figure 16:
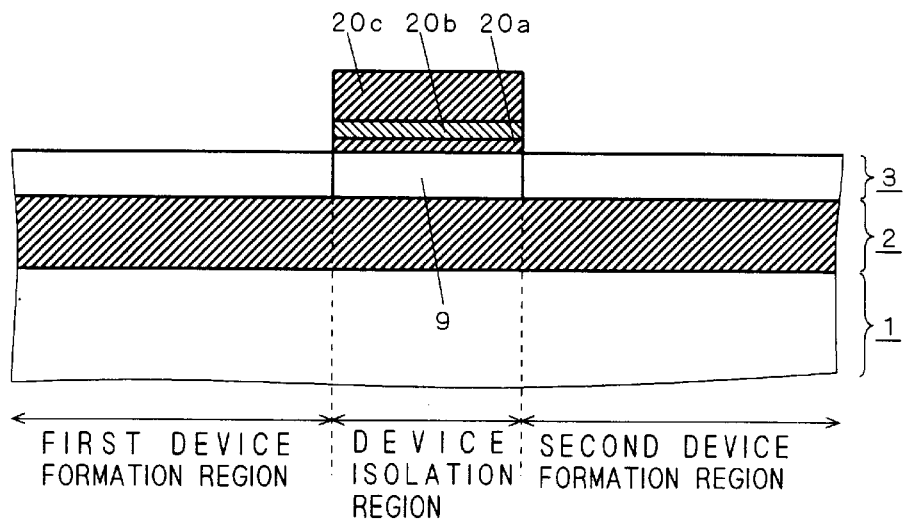
Figure 17:
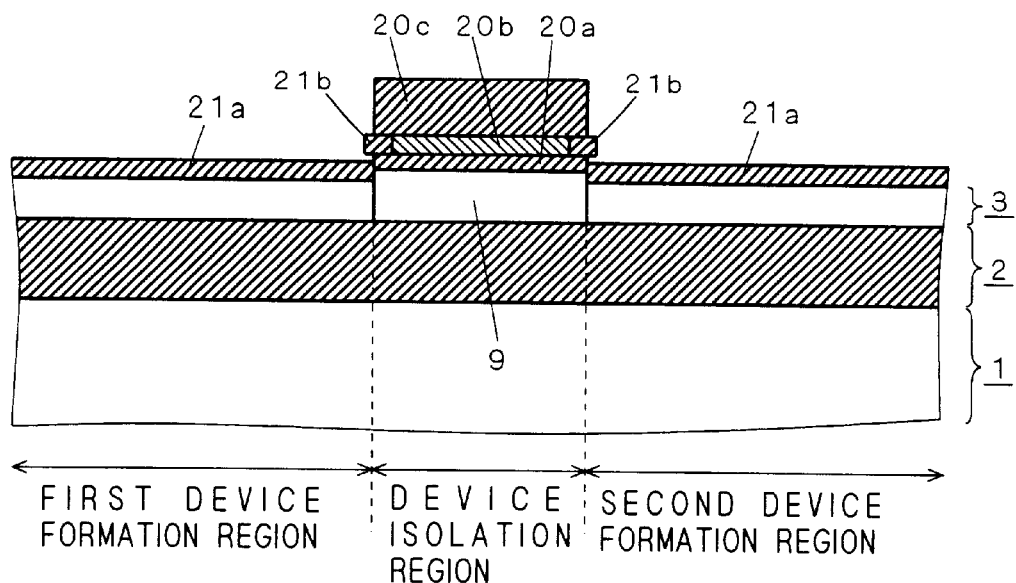

A thermal oxidation process is performed on a surface of the structure shown in FIG. 16 to thermally oxidize the upper surface of the SOI layer 3 in the first and second device formation regions and the side surfaces of the polysilicon film 20b, thereby forming silicon oxide films 21a and 21b, respectively (FIG. 17). As illustrated in FIG. 17, the silicon oxide film 21a is partially formed in the upper surface of the SOI layer 3. This thermal oxidation process accelerates the oxidation of the polysilicon film 20b implanted with the impurity such as phosphorus and boron. Hence, the silicon oxide films 21b are partially formed in the respective side surfaces of the polysilicon film 20b.

The silicon oxide film 21a is removed by wet etching using hydrofluoric acid and the like. This wet etching also removes parts of the silicon oxide films 21a, but the remaining parts of the silicon oxide films 21a are left as the silicon oxide films 21 in the respective side surfaces of the polysilicon film 20b. The above-described process steps provide the isolation structure 20 including the silicon oxide film 20a, the polysilicon film 20b with the silicon oxide films 21 formed in the respective side surfaces thereof, and the silicon oxide film 20c which are arranged in stacked relation in the order named on the upper surface of the SOI layer 3 in the device isolation region. The silicon oxide films 21 function to electrically isolate the polysilicon film 20b from the source/drain regions 8 and the gate electrodes 5.

In the above description, the thermal oxidation process step is performed to form the silicon oxide films 21 in the respective side surfaces of the polysilicon film 20b after the formation of the multilayer structure including the silicon oxide films 20a and 20c and the polysilicon film 20b. However, such a thermal oxidation process step may not be performed, but subsequent thermal oxidation for the formation of the gate oxide films 4 may be utilized also to form the silicon oxide films 21 in the respective side surfaces of the polysilicon film 20b.

In the method of manufacturing the semiconductor device according to the second preferred embodiment, the polysilicon film 20b serving as a conductive film included in the isolation structure 20 constitutes a capacitor between the isolation structure 20 and the SOI layer 3. The capacitor functions to suppress the influence of voltage, if any, applied to the isolation structure 20, for example. Therefore, the isolation structure 20 in the semiconductor device of the second preferred embodiment offers an isolation performance improvement over the isolating insulation film 6 of the first preferred embodiment which is comprised of only the insulation films.

For the formation of the isolation structure 20, the etching of the polysilicon film 20bb in the first and second device formation regions is stopped when the silicon oxide film 20aa is exposed, and thereafter the wet etching process which does not damage the SOI layer 3 is performed on the silicon oxide film 20aa to expose the upper surface of the SOI layer 3 in the first and second device formation regions. Therefore, the formation of the damaged layer in the upper surface of the SOI layer 3 is avoided when the isolation structure 20 is formed.

Additionally, the silicon oxide films 21 formed in the respective side surfaces of the polysilicon film 20b can electrically isolate the polysilicon film 20b from the source/drain regions 8 and the gate electrodes 5. The silicon oxide films 21 are formed by thermal oxidation. This thermal oxidation forms the silicon oxide film 21a in the upper surface of the SOI layer 3 in the first and second device formation regions, and the silicon oxide film 21a is removed in the subsequent step. This allows the SOI layer 3 in the first and second device formation regions to be thinner than that in the device isolation region. The channel formation regions 7 in the SOI layer 3 are accordingly made thinner. Therefore, the semiconductor device according to the second preferred embodiment can perform a stable operation even if a channel length is decreased with device size reduction.

Figure 18:
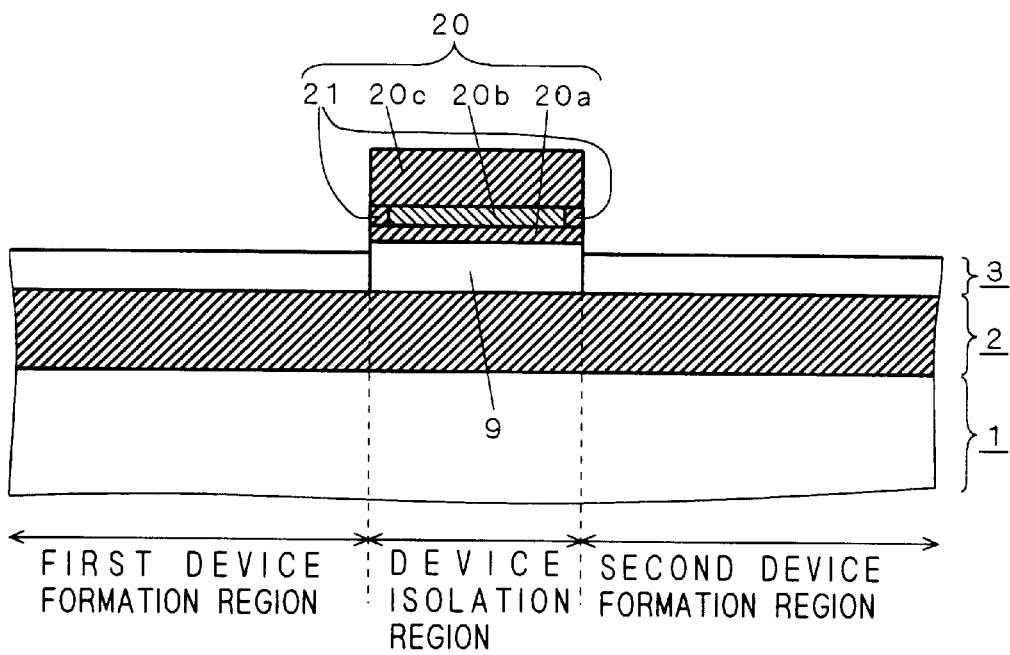
Figure 19:
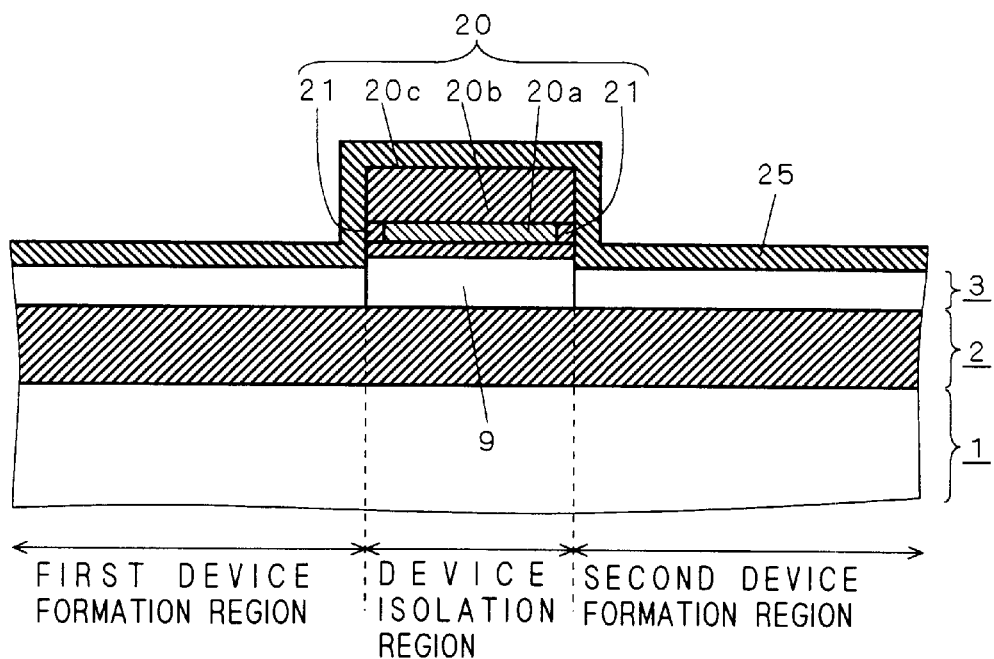
FIGS. 19 and 20 are cross-sectional views showing a method of manufacturing the semiconductor device in order of process steps according to the second preferred embodiment of the present invention.
Figure 20:
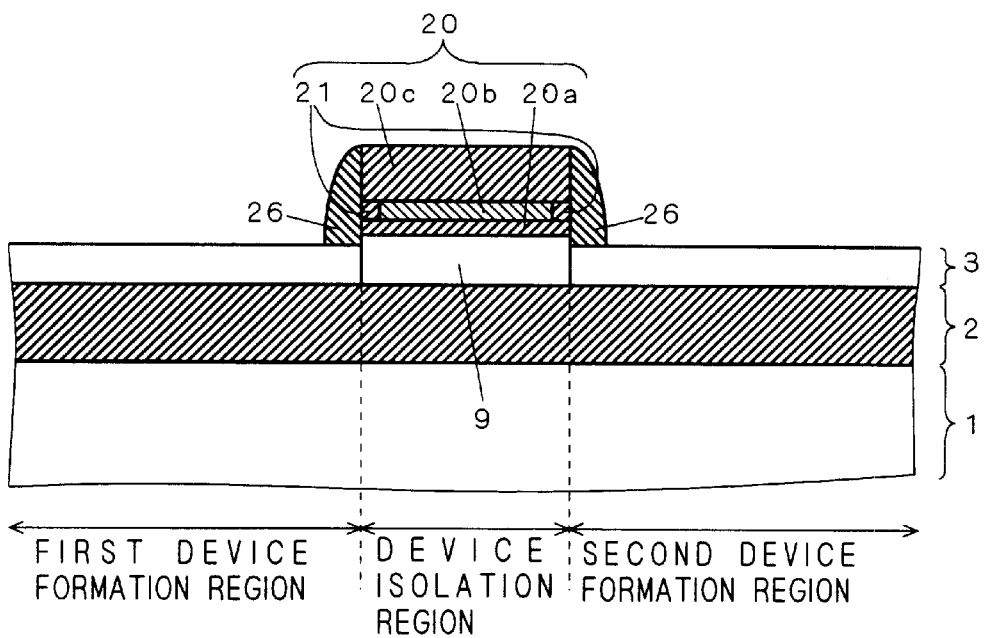

Referring to FIG. 18, the upper surface of the SOI layer 3 has a level difference on a boundary between the first and second device formation regions and the device isolation region. It is desirable to avoid the generation of a parasitic MOS transistor resulting from the level difference. FIGS. 19 and 20 are cross-sectional views showing another method of manufacturing the semiconductor device in order of process steps according to the second preferred embodiment. After the structure shown in FIG. 18 is provided by the above-mentioned method, a silicon oxide film 25 is formed entirely thereon by the CVD process and the like (FIG. 19). Then, anisotropic dry etching which exhibits a higher etch rate in a direction of the depth of the SOI substrate is performed on the silicon oxide film 25 to expose the upper surface of the SOI layer 3 in the first and second device formation regions. The above-described process steps provide sidewalls 26 of silicon oxide formed on respective side surfaces of the isolation structure 20 (FIG. 20). This reduces the level difference of the upper surface of the SOI layer 3 to suppress the generation of a parasitic MOS transistor.

Figure 21:
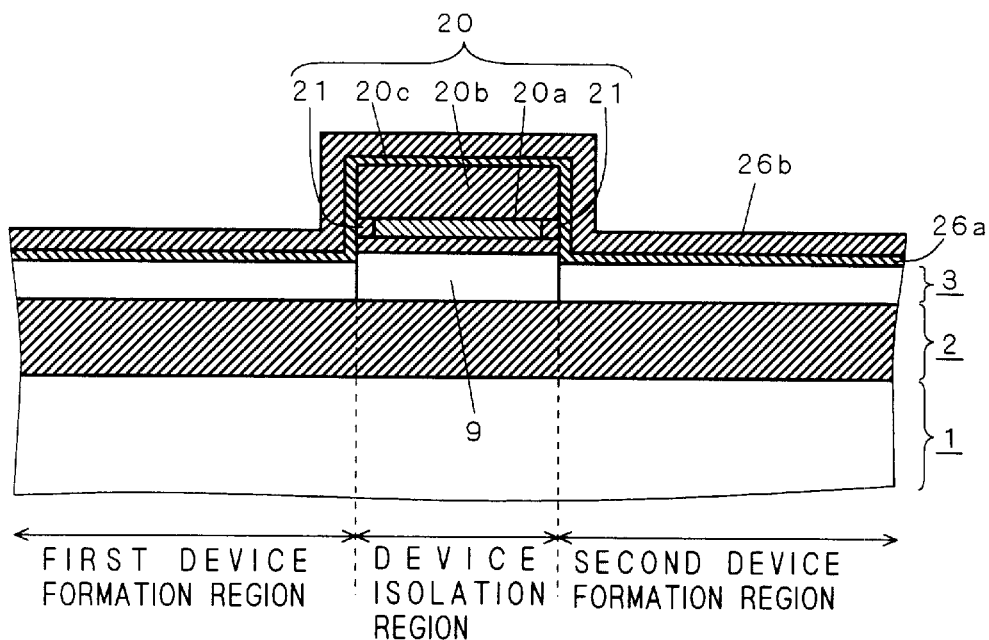
FIGS. 21 and 22 are cross-sectional views showing a method of forming sidewalls in order of process steps.
Figure 22:
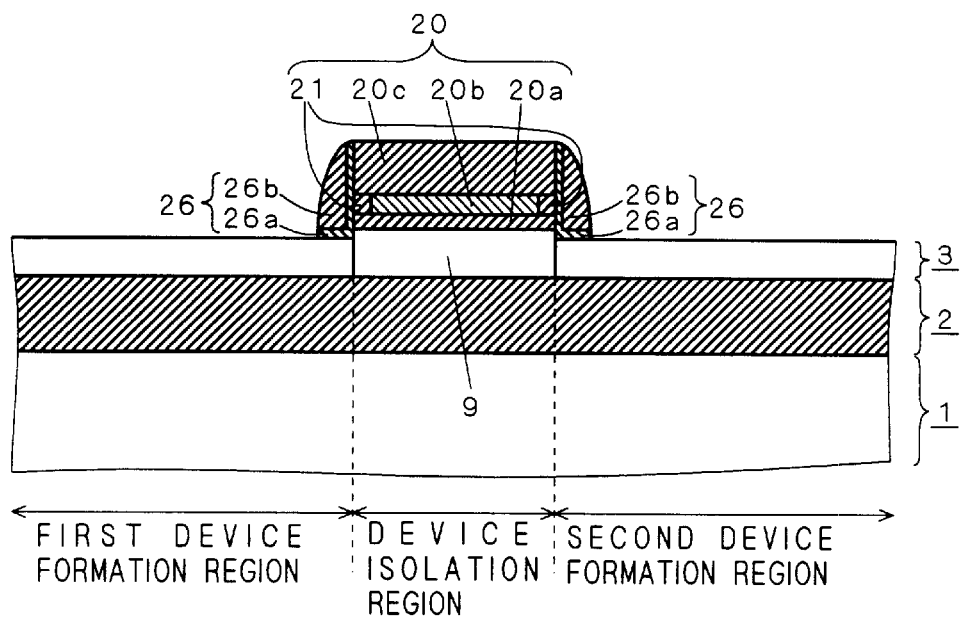

It is further desirable to avoid the formation of the damaged layer in the upper surface of the SOI layer 3 which results from the anisotropic dry etching for the formation of the sidewalls 26. FIGS. 21 and 22 are cross-sectional views showing another method of forming the sidewalls 26 in order of process steps. First, a thin silicon oxide film 26a and a silicon nitride film 26b are deposited in the order named by the CVD process and the like (FIG. 21). Then, anisotropic dry etching which exhibits a higher etch rate in a direction of the depth of the SOI substrate is performed on the silicon nitride film 26b using the thin silicon oxide film 26a as an etch stopper. The thin silicon oxide film 26a in the first and second device formation regions is removed by wet etching using hydrofluoric acid and the like to expose the upper surface of the SOI layer 3 (FIG. 22). This avoids the formation of the damaged layer in the upper surface of the SOI layer 3 when the sidewalls 26 are formed.

Figure 23:
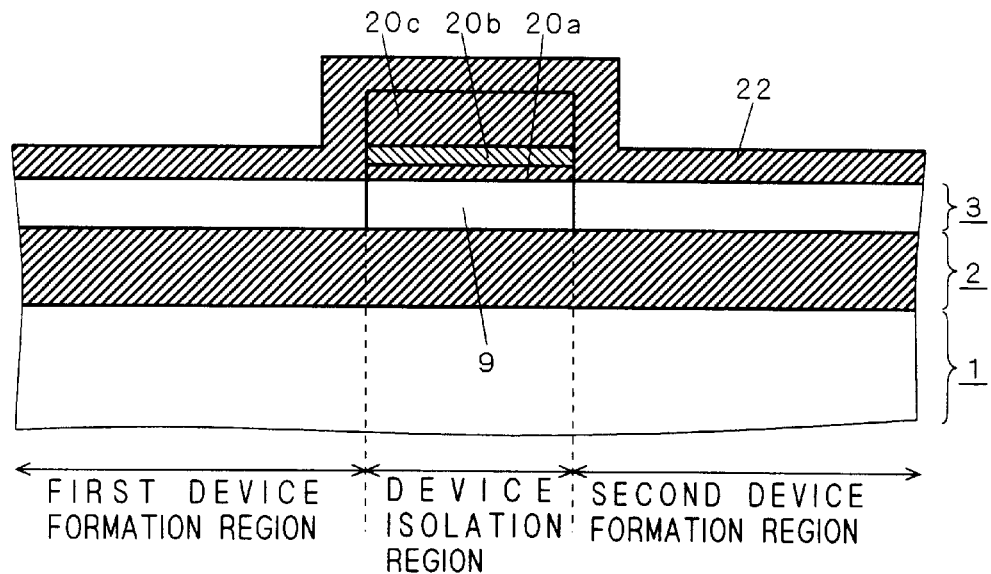
FIGS. 23 and 24 are cross-sectional views showing another method of forming the isolation structure in order of process steps according to the second preferred embodiment of the present invention.
Figure 24:
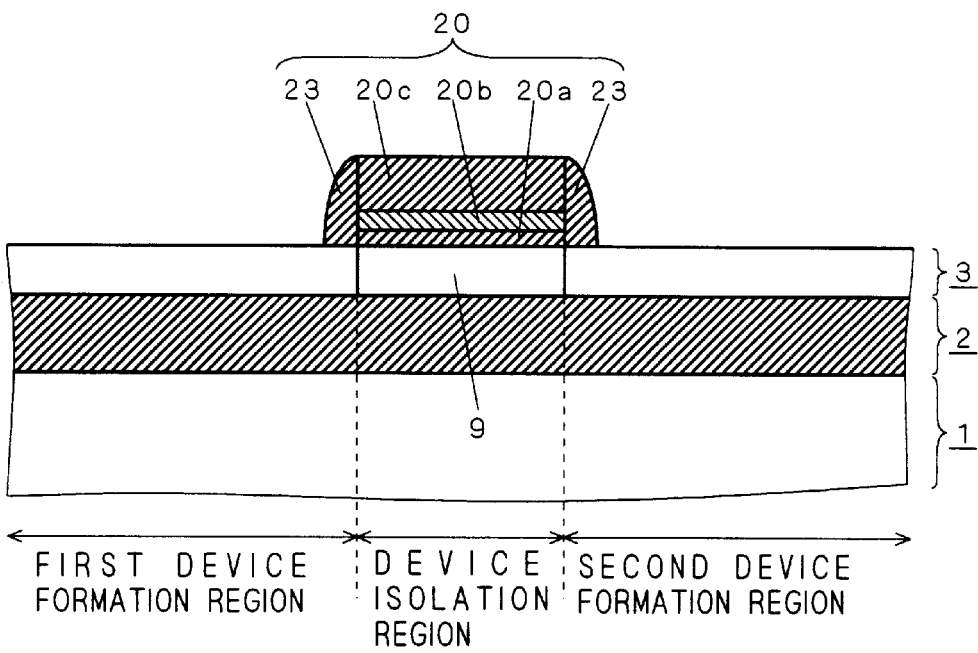

In the above description, the silicon oxide films 21 are formed in the respective side surfaces of the polysilicon film 20b to electrically isolate the polysilicon film 20b from the source/drain regions 8 and the gate electrodes 5. This isolation may be achieved by forming sidewalls of an insulative material on respective side surfaces of the polysilicon film 20b. FIGS. 23 and 24 are cross-sectional views showing another method of forming the isolation structure 20 in order of process steps according to the second preferred embodiment. After the structure shown in FIG. 16 is provided by the above-described method, a silicon oxide film 22 is formed entirely thereon by the CVD process and the like (FIG. 23). Then, anisotropic dry etching which exhibits a higher etch rate in a direction of the depth of the SOI substrate is performed on the silicon oxide film 22 to expose the upper surface of the SOI layer 3. This provides sidewalls 23 of silicon oxide formed on the respective side surfaces of the multilayer structure including the silicon oxide films 20a and 20c and the polysilicon film 20b. The above-mentioned process steps provide the isolation structure 20 including the silicon oxide films 20a and 20c, the polysilicon film 20b and the sidewalls 23 on the upper surface of the SOI layer 3 in the device isolation region (FIG. 24). The sidewalls 23 can electrically isolate the polysilicon film 20b from the source/drain regions 8 and the gate electrodes 5.

It is further desirable to avoid the formation of the damaged layer in the upper surface of the SOI layer 3 which results from the anisotropic dry etching for the formation of the sidewalls 23. This may be achieved by depositing a thin silicon oxide film and a silicon nitride film in the order named in place of forming the silicon oxide film 22, performing anisotropic dry etching on the silicon nitride film using the thin silicon oxide film as an etch stopper, and performing wet etching on the thin silicon oxide film to expose the upper surface of the SOI layer 3 in the manner described with reference to FIGS. 21 and 22.

When the polysilicon film 20b is included in the isolation structure 20 as illustrated in the method of the second preferred embodiment, electric charges might be introduced into the polysilicon film 20b in a manufacturing process using plasma. The electric charges introduced into the polysilicon film 20b varies the threshold voltage of a MOS transistor to cause the unstable operation thereof. To remove the electric charges accumulated in the polysilicon film 20b, the step of exposing the polysilicon film 20b to ultraviolet light may be performed after all manufacturing processes using plasma. This stabilizes the operation of the MOS transistor.

Third Preferred Embodiment

Figure 25:
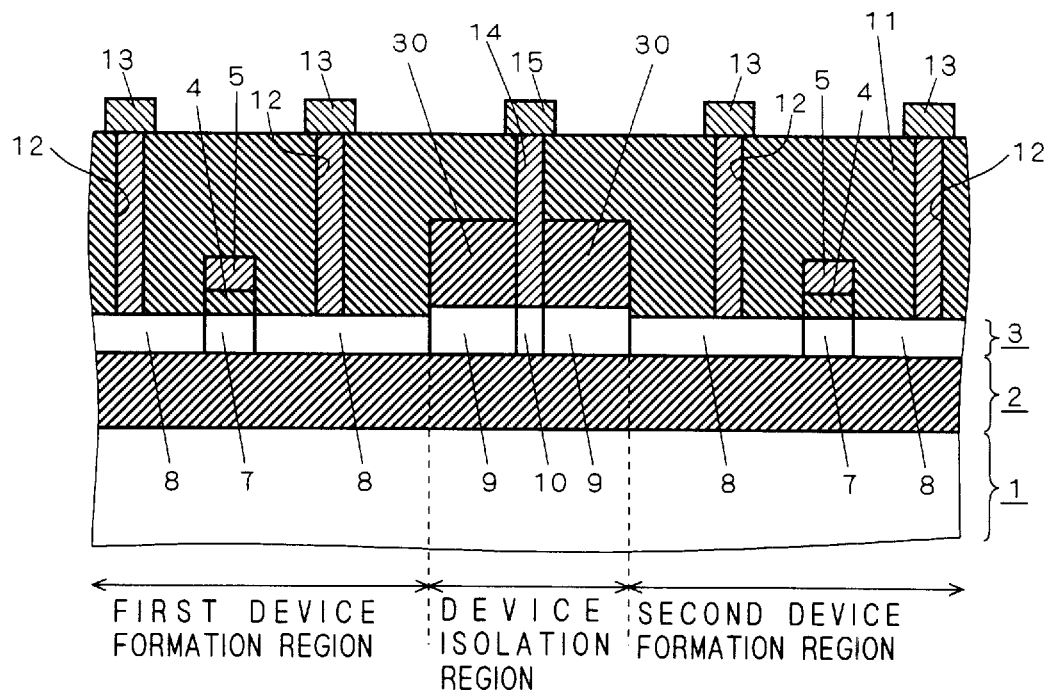
FIG. 25 is a cross-sectional view of the semiconductor device according to a third preferred embodiment of the present invention.

FIG. 25 is a cross-sectional view of the semiconductor device employing the SOI substrate according to a third preferred embodiment of the present invention. The semiconductor device of FIG. 25 comprises an isolating insulation film 30 in place of the isolating insulation film 6 shown in FIG. 1. The SOI layer 3 in the first and second device formation regions is thinner than that in the device isolation region. The remaining structure of the semiconductor device according to the third preferred embodiment is similar to that of the semiconductor device of FIG. 1 according to the first preferred embodiment.

Figure 26:
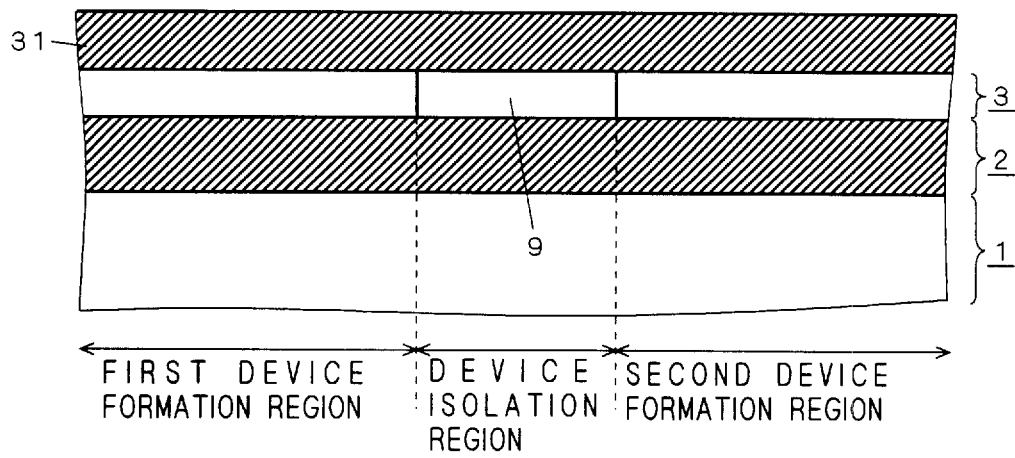
FIGS. 26 through 30 are cross-sectional views showing a method of forming the isolating insulation film in order of process steps according to the third preferred embodiment of the present invention.
Figure 27:
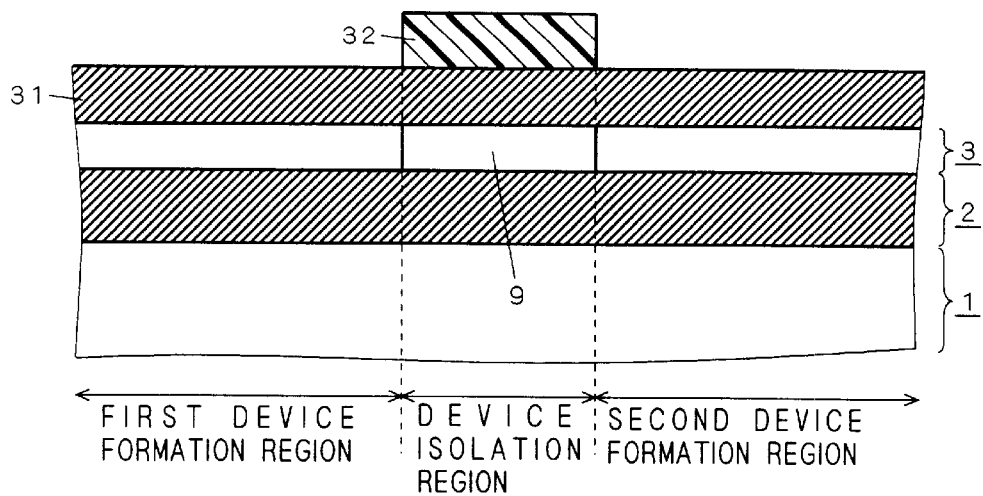
Figure 28:
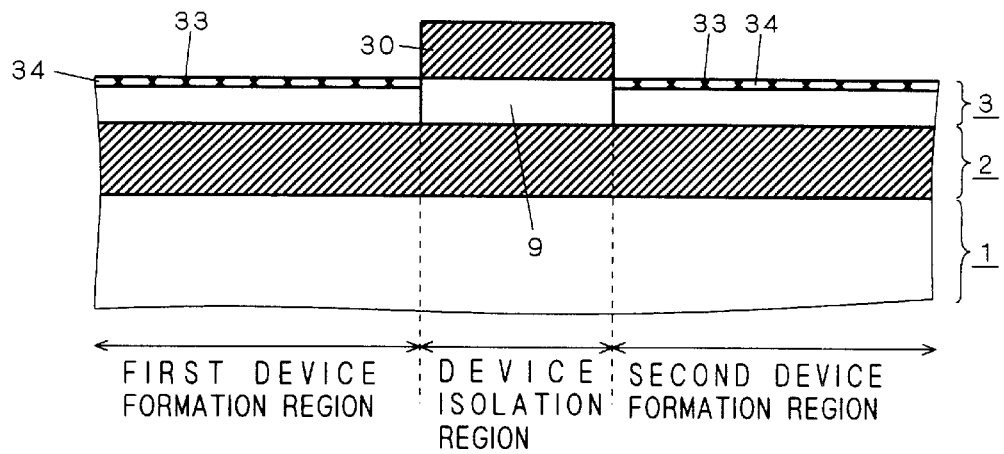

A method of forming the isolating insulation film 30 in the semiconductor device shown in FIG. 25 will now be described. FIGS. 26 through 30 are cross-sectional views showing the method of forming the isolating insulation film 30 in order of process steps according to the third preferred embodiment. Initially, a silicon oxide film 31 is formed by the thermal oxidation or CVD process and the like on the upper surface of the SOI layer 3 in which the channel formation regions 7 and the well region 9 are formed (FIG. 26). Next, a photoresist 32 is formed on an upper surface of the silicon oxide film 31 in the device isolation region by the photolithographic technique (FIG. 27). Using the photoresist 32 as a mask, anisotropic dry etching which exhibits a higher etch rate in a direction of the depth of the SOI substrate is performed on the silicon oxide film 31 to expose the upper surface of the SOI layer 3. An unetched part of the silicon oxide film 31 serves as the isolating insulation film 30 on the upper surface of the SOI layer 3 in the device isolation region. Thereafter, the photoresist 32 is removed (FIG. 28). As illustrated in FIG. 28, this etching process forms a damaged layer 34 containing defects 33 in the upper surface of the SOI layer 3 in the first and second device formation regions.

Figure 29:
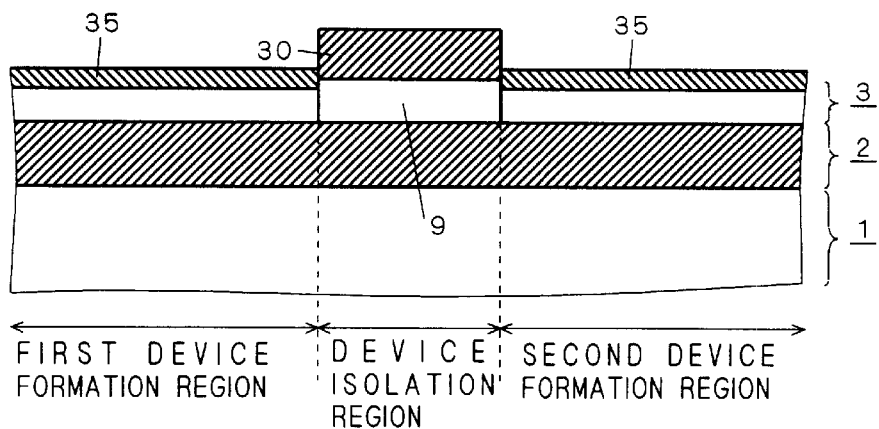
Figure 30:
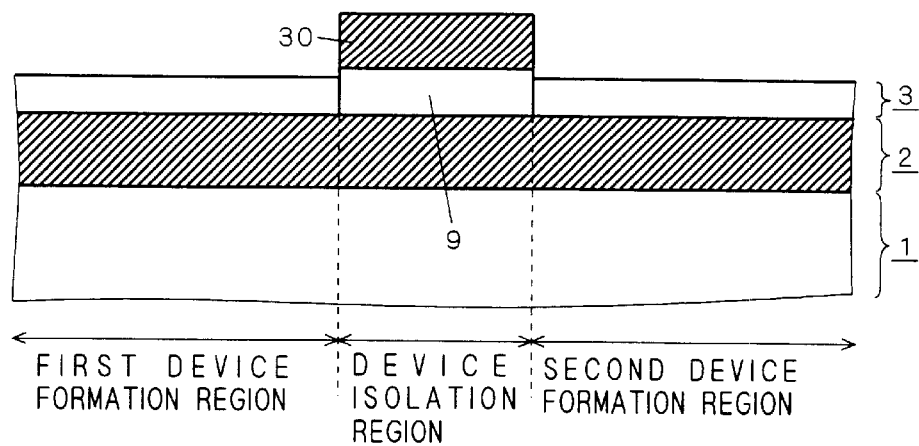

The upper surface of the SOI layer 3 in the first and second device formation regions is thermally oxidized to form a sacrificial oxide film 35 of silicon oxide (FIG. 29). The thickness of part of the sacrificial oxide film 35 which lies in the upper surface of the SOI layer 3 is adjusted to be not less than the depth of the damaged layer 34 from the upper surface of the SOI layer 3. The sacrificial oxide film 35 is removed by wet etching using hydrofluoric acid and the like to expose the upper surface of the SOI layer 3 in the first and second device formation regions (FIG. 30). As illustrated in FIG. 30, the thickness of the SOI layer 3 in the first and second device formation regions as a result of the removal of the sacrificial oxide film 35 is less than the thickness of the SOI layer 3 in the device isolation region.

In the method of manufacturing the semiconductor device according to the third preferred embodiment, the upper surface of the SOI layer 3 in the first and second device formation regions is exposed by the anisotropic dry etching for the formation of the isolating insulation film 30, and thereafter the sacrificial oxide film 35 is formed at the exposed upper surface of the SOI layer 3. The removal of the sacrificial oxide film 35 also removes the damaged layer 34 formed in the upper surface of the SOI layer 3.

The removal of the sacrificial oxide film 35 causes the SOI layer 3 in the first and second device formation regions to be thinner than that in the device isolation region. The channel formation regions 7 in the SOI layer 3 are accordingly made thinner. Therefore, the semiconductor device according to the third preferred embodiment can perform a stable operation even if a channel length is decreased.

Figure 31:
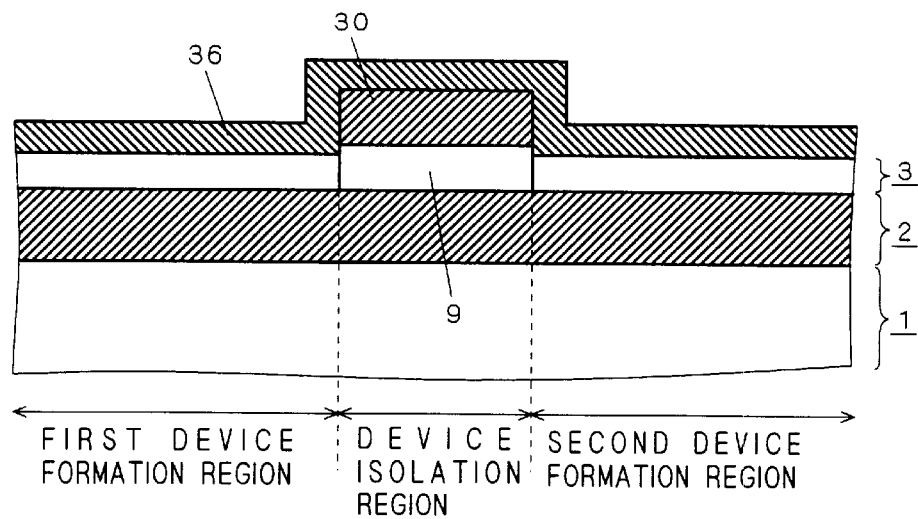
FIGS. 31 and 32 are cross-sectional views showing another method of forming the isolating insulation film in order of process steps according to the third preferred embodiment of the present invention.
Figure 32:
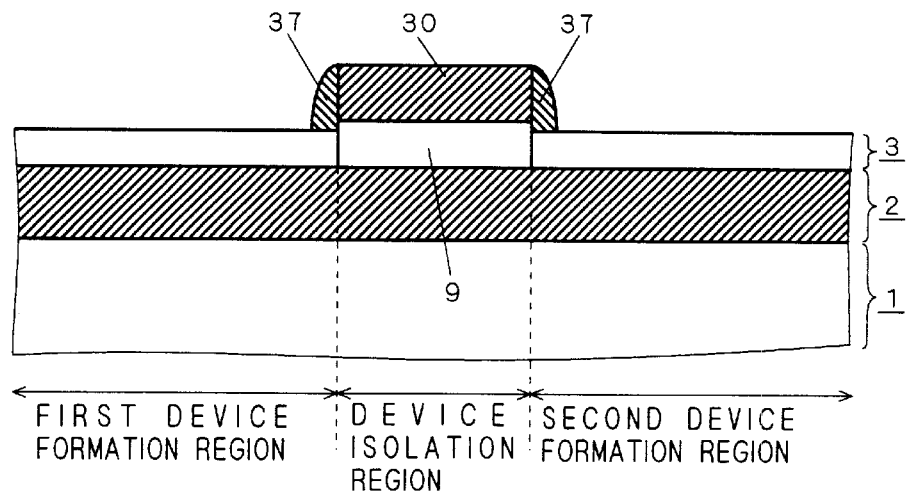

Referring to FIG. 30, the upper surface of the SOI layer 3 has a level difference on a boundary between the first and second device formation regions and the device isolation region. It is desirable to avoid the generation of a parasitic MOS transistor resulting from the level difference. FIGS. 31 and 32 are cross-sectional views showing another method of forming the isolating insulation film 30 in order of process steps according to the third preferred embodiment. After the structure shown in FIG. 30 is provided by the above-mentioned method, a silicon oxide film 36 is formed entirely thereon by the CVD process and the like (FIG. 31). Then, anisotropic dry etching which exhibits a higher etch rate in a direction of the depth of the SOI substrate is performed on the silicon oxide film 36 to expose the upper surface of the SO layer 3 in the first and second device formation regions. This provides sidewalls 37 of silicon oxide formed on the respective side surfaces of the isolating insulation film 30 (FIG. 32). Thus, the formation of the sidewalls 37 on the respective side surfaces of the isolating insulation film 30 reduces the level difference of the upper surface of the SOI layer 3 to suppress the generation of a parasitic MOS transistor.

It is further desirable to avoid the formation of the damaged layer in the upper surface of the SOI layer 3 which results from the anisotropic dry etching for the formation of the sidewalls 37. This may be achieved by depositing a thin silicon oxide film and a silicon nitride film in the order named in place of forming the silicon oxide film 36, performing anisotropic dry etching on the silicon nitride film using the thin silicon oxide film as an etch stopper, and performing wet etching on the thin silicon oxide film to expose the upper surface of the SOI layer 3 in the manner described with reference to FIGS. 21 and 22.

Fourth Preferred Embodiment

Figure 33:
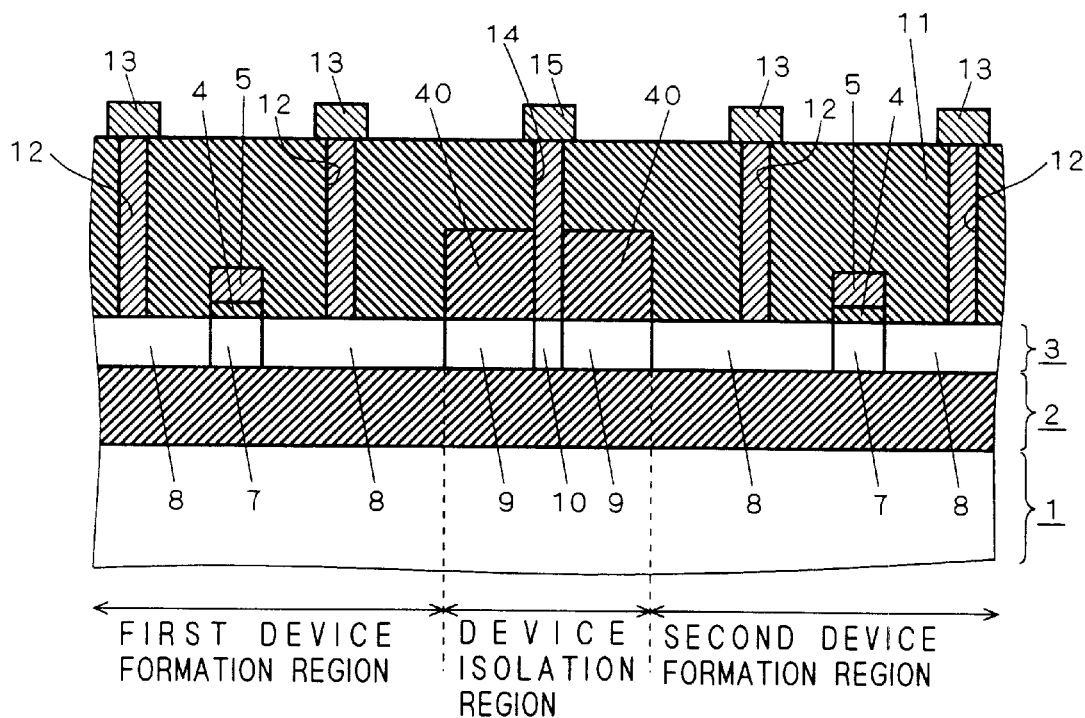
FIG. 33 is a cross-sectional view of the semiconductor device according to a fourth preferred embodiment of the present invention.

FIG. 33 is a cross-sectional view of the semiconductor device employing the SOI substrate according to a fourth preferred embodiment of the present invention. The semiconductor device of FIG. 33 comprises an isolating insulation film 40 of silicon oxide in place of the isolating insulation film 6 shown in FIG. 1. The remaining structure of the semiconductor device according to the fourth preferred embodiment is similar to that of the semiconductor device of FIG. 1 according to the first preferred embodiment.

Figure 34:
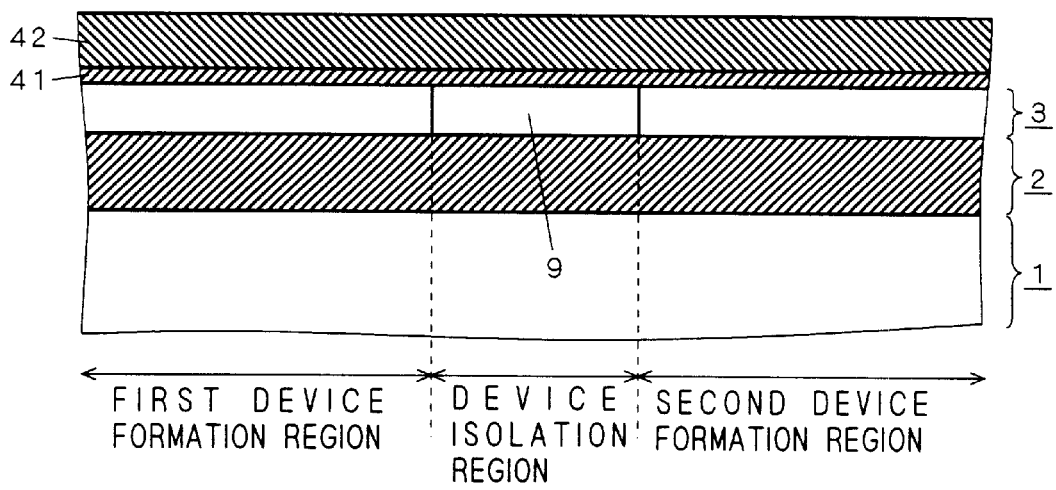
FIGS. 34 through 39 are cross-sectional views showing a method of forming the isolating insulation film in order of process steps according to the fourth preferred embodiment of the present invention.

A method of forming the isolating insulation film 40 in the semiconductor device shown in FIG. 33 will now be described. FIGS. 34 through 39 are cross-sectional views showing the method of forming the isolating insulation film 40 in order of process steps according to the fourth preferred embodiment. Initially, a silicon oxide film 41 is formed by the thermal oxidation or CVD process and the like on the upper surface of the SOI layer 3 in which the channel formation regions 7 and the well region 9 are formed. Next, a silicon nitride film 42 is formed on an upper surface of the silicon oxide film 41 by the CVD process and the like (FIG. 34).

Figure 35:
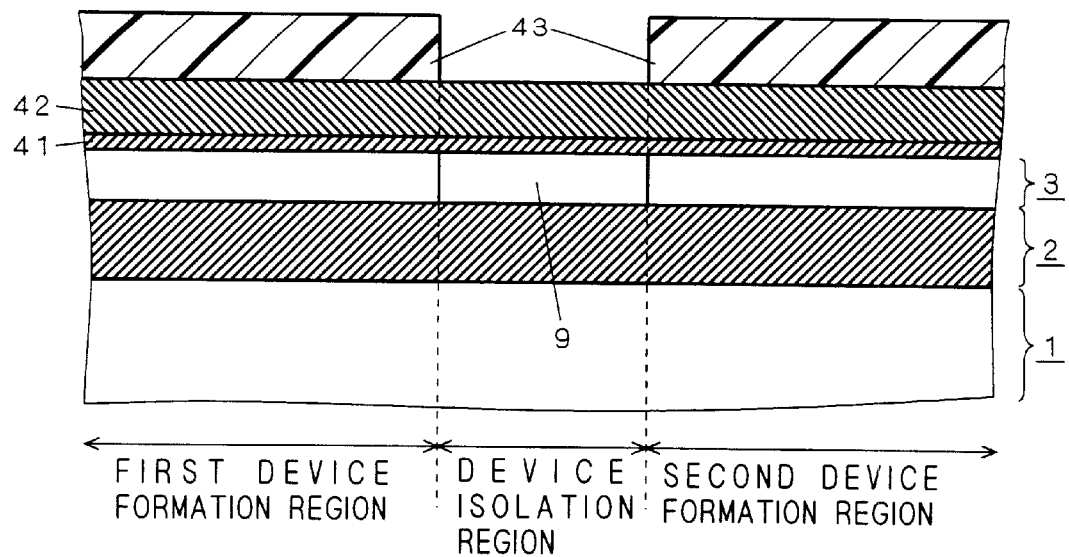
Figure 36:
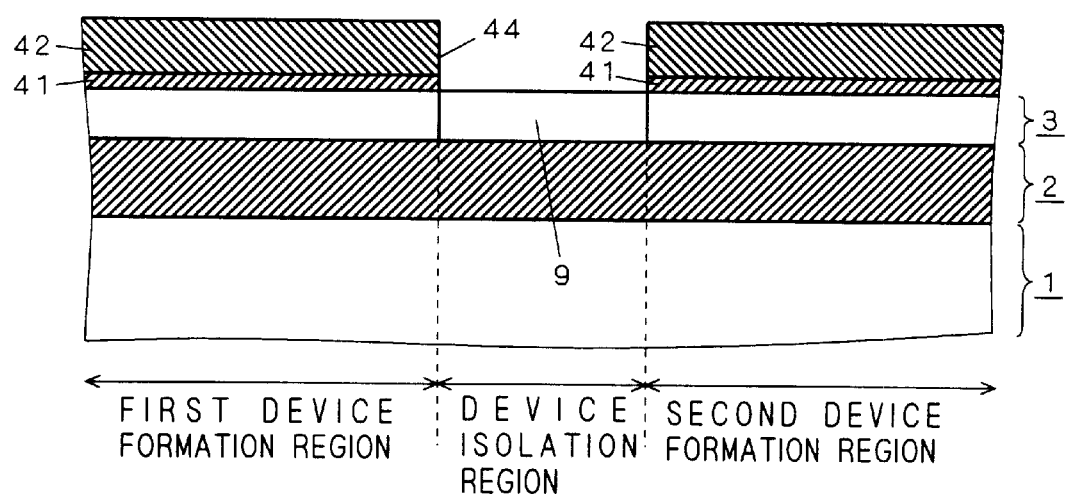

Then, a photoresist 43 is formed on an upper surface of the silicon nitride film 42 in the first and second device formation regions by the photolithographic technique (FIG. 35). Using the photoresist 43 as a mask, anisotropic dry etching which exhibits a higher etch rate in a direction of the depth of the SOI substrate is performed on the silicon nitride film 42 and the silicon oxide film 41 in this order to expose the upper surface of the SOI layer 3 in the device isolation region. Thereafter, the photoresist 43 is removed (FIG. 36). As illustrated in FIG. 36, a recessed part 44 is formed on the upper surface of the SOI layer 3 in the device isolation region. After the upper surface of the SOI layer 3 is exposed in the device isolation region, an impurity may be introduced into the well region 9 by ion implantation to form a channel stop layer. This improves the punchthrough resistance of the isolating insulation film 40 and also prevents the generation of an inversion layer at the surface of the SOI layer 3.

Figure 37:
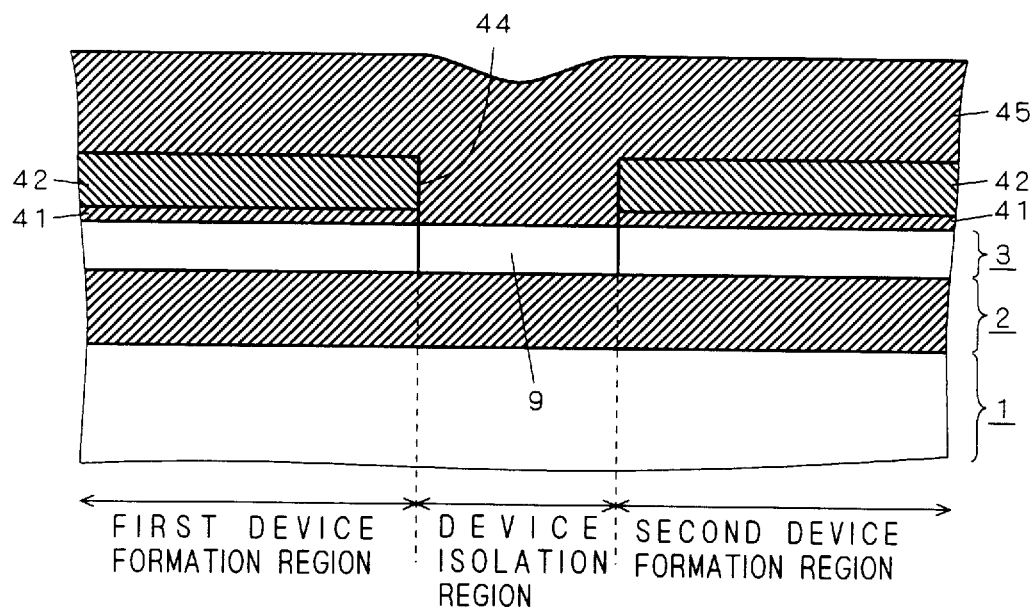
Figure 38:
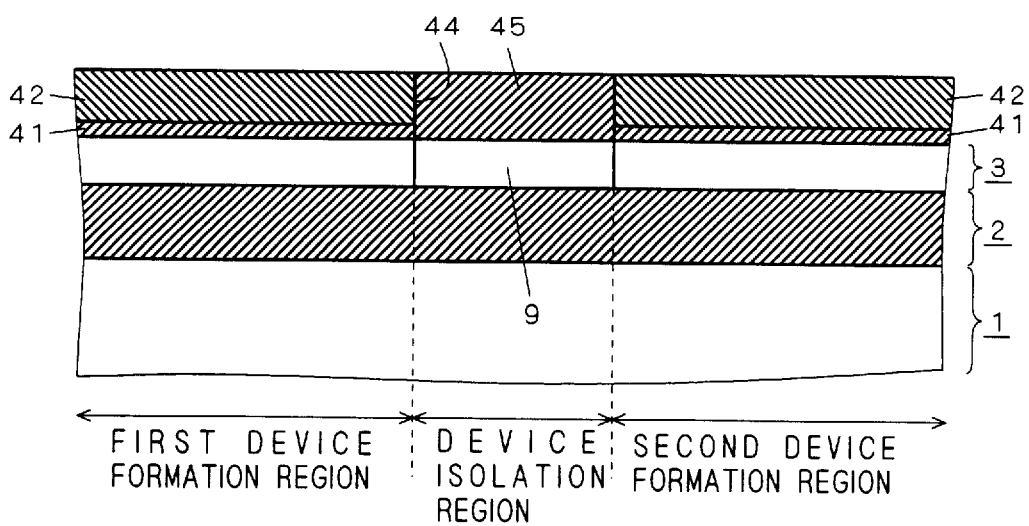
Figure 39:
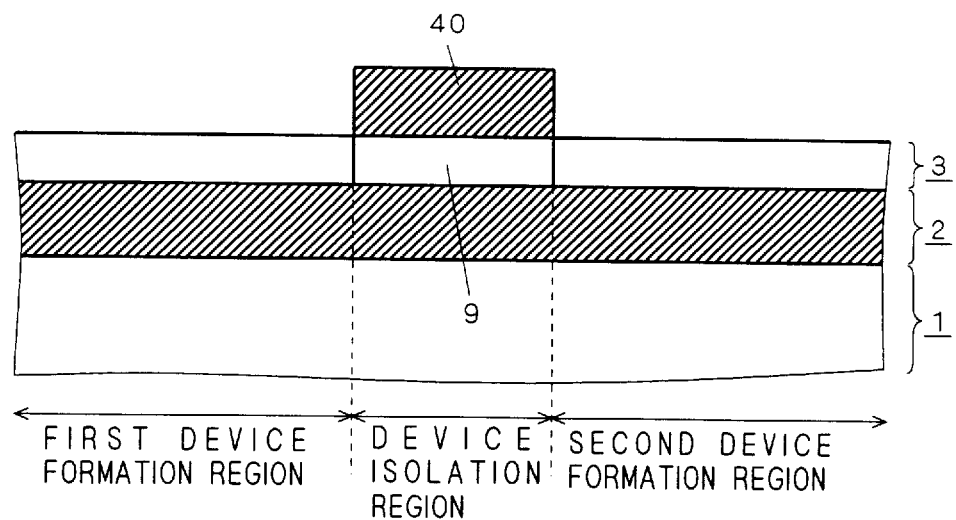

A silicon oxide film 45 is formed on the entire top surface of the resultant structure by the CVD process and the like so as to fill the recessed part 44 (FIG. 37). The silicon oxide film 45 is polished by the CMP (Chemical Mechanical Polishing) process until the upper surface of the silicon nitride film 42 is exposed for surface planarization (FIG. 38). The silicon nitride film 42 is removed by wet etching using phosphoric acid and the like, and thereafter the silicon oxide film 41 is removed by wet etching using hydrofluoric acid and the like, thereby exposing the upper surface of the SOI layer 3 in the first and second device formation regions (FIG. 39). The above-described process steps leaves the silicon oxide film 45 on the upper surface of the SOI layer 3 in the device isolation region to provide the isolating insulation film 40.

In the method of manufacturing the semiconductor device according to the fourth preferred embodiment, the silicon nitride film 42 and the silicon oxide film 41 are removed by the respective wet etching processes to expose the upper surface of the SOI layer 3 in the first and second device formation regions. This avoids the formation of the damaged layer in the upper surface of the SOI layer 3 in the first and second device formation regions when the isolating insulation film 40 is formed.

The silicon oxide film 41 and the silicon nitride film 42 are arranged in stacked relation in the order named on the upper surface of the SOI layer 3 in the above description. Alternatively, a silicon oxide film, a polysilicon film and a silicon nitride film may be arranged in stacked relation in the order named, in which case similar effects are produced.

Fifth Preferred Embodiment

Modifications of the semiconductor device of the first to fourth preferred embodiments will be described according to a fifth preferred embodiment of the present invention.

Figure 40:
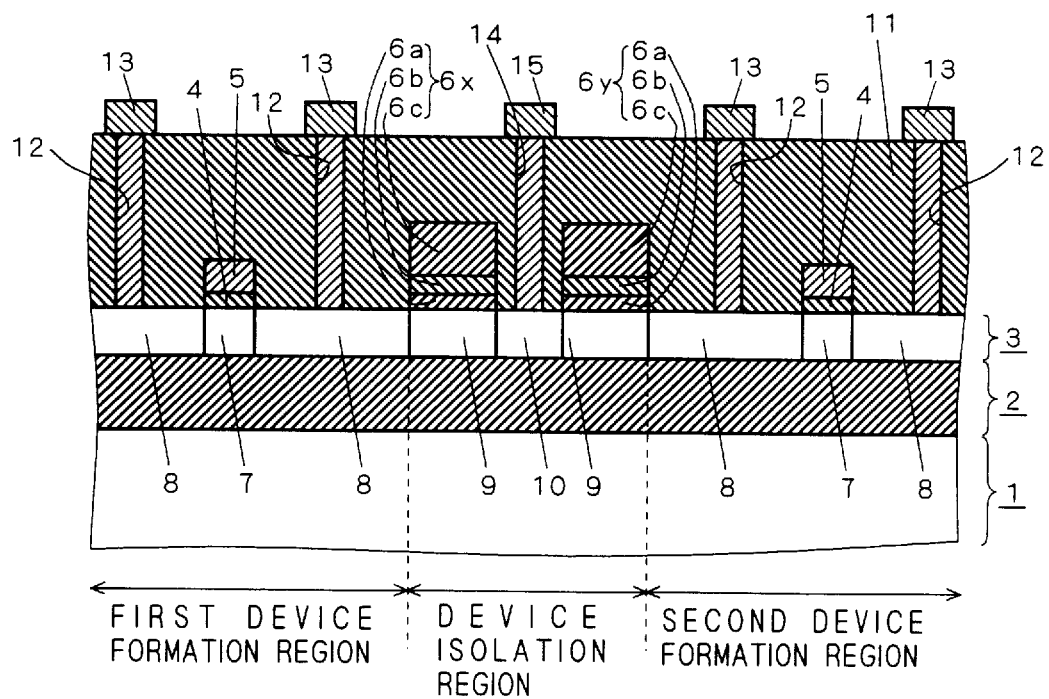
FIG. 40 is a cross-sectional view of the semiconductor device according to a fifth preferred embodiment of the present invention.

FIG. 40 is a cross-sectional view of a modification of the semiconductor device according to the fifth preferred embodiment of the present invention. In the semiconductor device of FIG. 1 according to the first preferred embodiment, the contact hole 14 for establishing an electric connection between the substrate electrode 15 and the body region 10 extends through the interlayer insulation film 11 and the isolating insulation film 6. Instead, as shown in FIG. 40, isolating insulation films 6x and 6y may be separately formed on the SOI layer 3 in the device isolation region, with the contact hole 14 extending only through the interlayer insulation film 11, but not through the isolating insulation films 6x and 6y. Such a modification may be applied also to the semiconductor device of the second, third and fourth preferred embodiments shown in FIGS. 11, 25 and 33.

Figure 41:
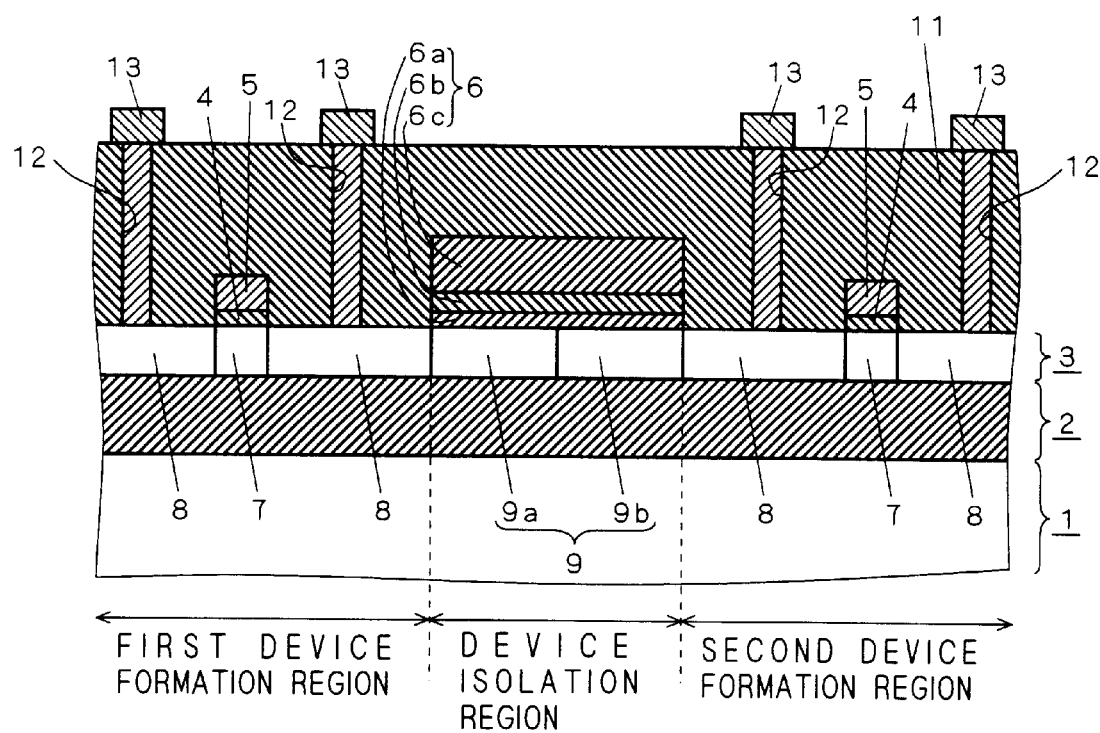
FIG. 41 is a cross-sectional view of the semiconductor device in another form according to the fifth preferred embodiment of the present invention.

FIG. 41 is a cross-sectional view of another modification of the semiconductor device according to the fifth preferred embodiment of the present invention. In the semiconductor device of FIG. 1 according to the first preferred embodiment, the NMOS transistor is formed in each of the first and second device formation regions, and hence the p-type impurity is implanted into the SOI layer 3 in the device isolation region to form the well region 9. In the semiconductor device of FIG. 41 according to the fifth preferred embodiment, on the other hand, an NMOS transistor is formed in the first device formation region and a PMOS transistor is formed in the second device formation region. In this case, a p-type impurity is introduced into part of the well region 9 which is closer to the first device formation region to form a well region 9a whereas an n-type impurity is introduced into part of the well region 9 which is closer to the second device formation region to form a well region 9b, as shown in FIG. 41. Such a modification may be applied also to the semiconductor device of the second, third and fourth preferred embodiments shown in FIGS. 11, 25 and 33.

Figure 42:
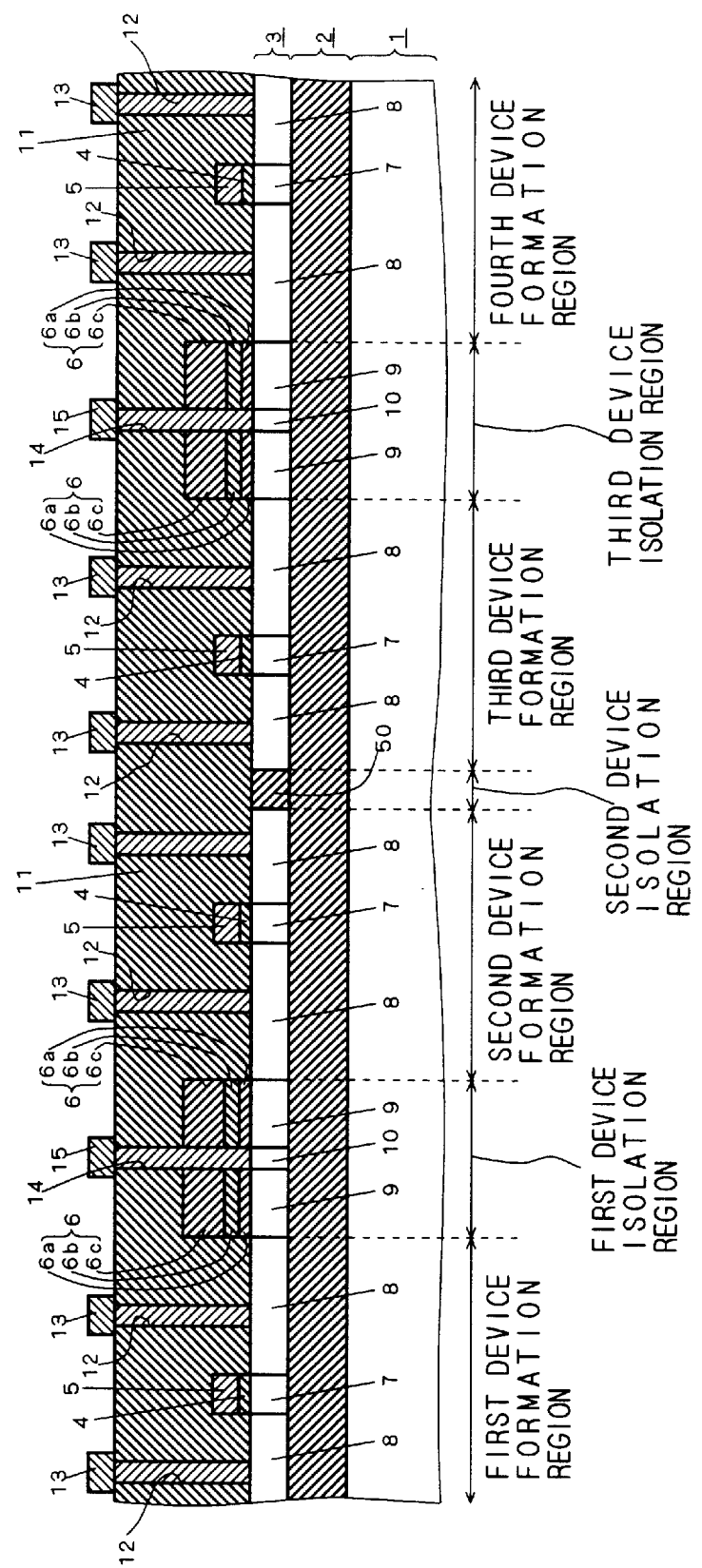
FIG. 42 is a cross-sectional view of the semiconductor device in still another form according to the fifth preferred embodiment of the present invention.

FIG. 42 is a cross-sectional view of still another modification of the semiconductor device according to the fifth preferred embodiment of the present invention. An NMOS transistor is formed in each of the first and second device formation regions in the SOI substrate, and a PMOS transistor is formed in each of third and fourth device formation regions. The isolating insulation film 6 of the first preferred embodiment is formed in each of the first device isolation region for providing electrical isolation between the NMOS transistors and a third device isolation region for providing electrical isolation between the PMOS transistors. A trench-type isolating insulation film 50 is formed by the known trench-isolation technique in the SOI layer 3 in the second device isolation region for providing electrical isolation between the NMOS transistor and the PMOS transistor. The trench-type isolating insulation film 50 having high isolation performance can provide electrical isolation between the PMOS transistor and the NMOS transistor to prevent latchup from occurring between the PMOS transistor and the NMOS transistor.

In this manner, the isolating insulation film 6 formed on the upper surface of the SOI layer 3 and the trench-type isolating insulation film 50 formed in the SOI layer 3 may be used in combination. Then, the trench-type isolating insulation film 50 may be used to electrically isolate circuits which are less affected by the floating-substrate effect but require a high level of integration from each other whereas the isolating insulation film 6 capable of fixing the electric potential of the substrate may be used to electrically isolate circuits which do not need a high level of integration but are significantly affected by the floating-substrate effect from each other. For example, the trench-type isolating insulation film 50 is employed for internal circuits, and the isolating insulation film 6 is employed for I/O buffer circuits. Alternatively, the trench-type isolating insulation film 50 is employed for digital circuits, and the isolating insulation film 6 is employed for analog circuits. The circuits significantly affected by the floating-substrate effect include an I/O buffer circuit, an analog circuit such as a PLL (Phase Locked Loop) circuit and a sense amplifier, a timing circuit, and a dynamic circuit. In other applications, the trench-type isolating insulation film 50 may be disposed between a noise source such as an I/O circuit and a high-frequency circuit, and a peripheral circuit thereof to reduce the influence of noises upon the internal circuit.

Figure 43:
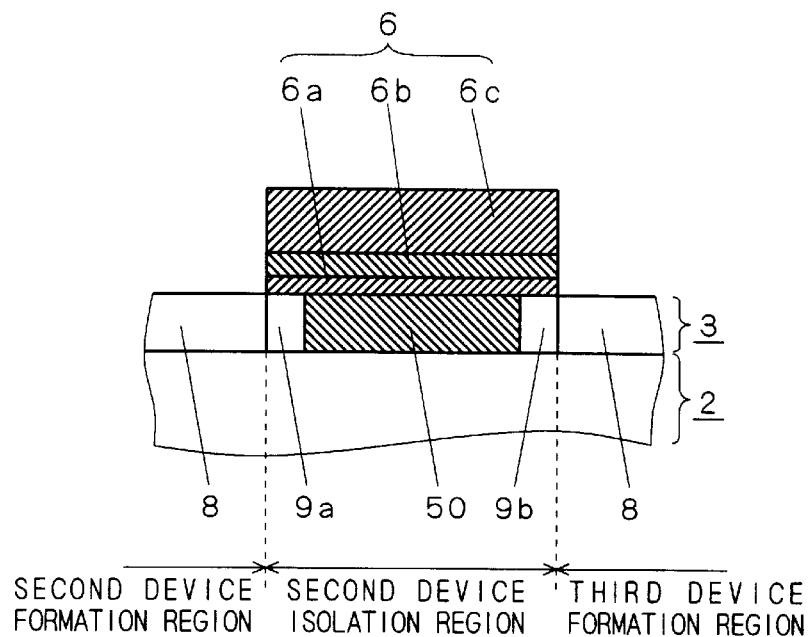
FIG. 43 is a cross-sectional view of another form of a trench-type isolating insulation film shown in FIG. 42.
Figure 44:
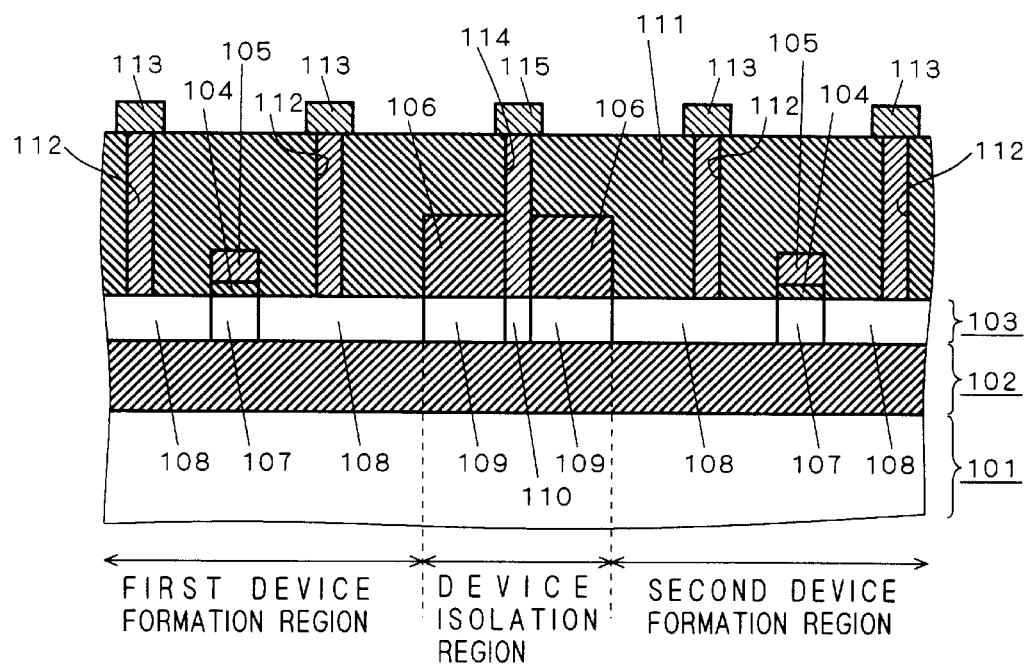
FIG. 44 is a cross-sectional view of a background art semiconductor device.
Figure 45:
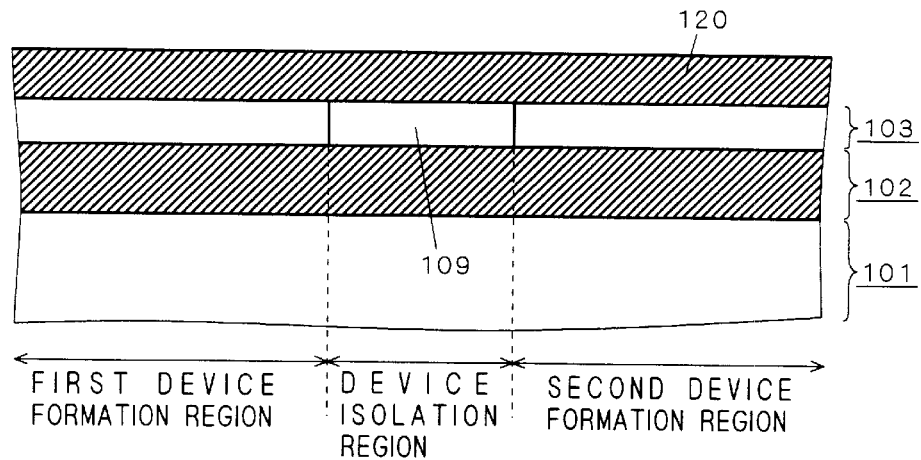
FIGS. 45 through 47 are cross-sectional views showing a background art method of forming an isolation oxide film in order of process steps.
Figure 46:
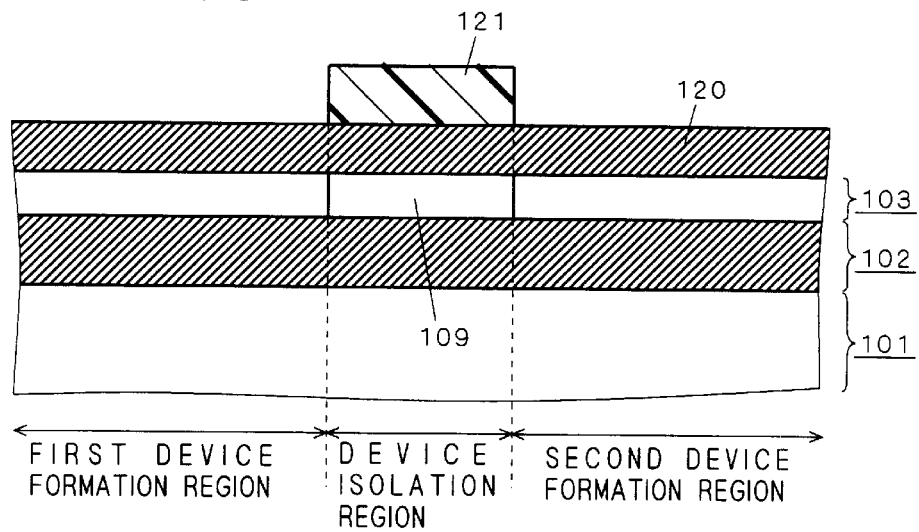
Figure 47:
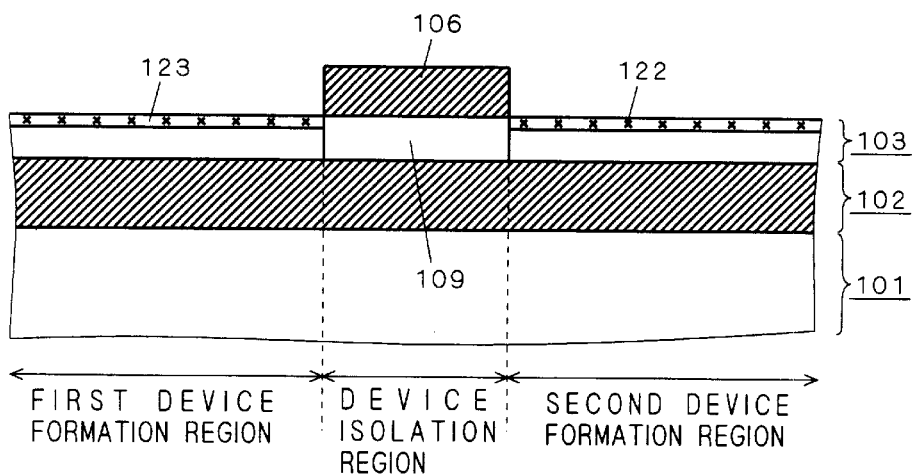

FIG. 43 is a cross-sectional view of another structure of the trench-type isolating insulation film 50 shown in FIG. 42. The well region 9a doped with a p-type impurity may be formed in part of the SOI layer 3 which is adjacent to the trench-type isolating insulation film 50 and closer to the second device formation region, and the well region 9b doped with an n-type impurity may be formed in part of the SOI layer 3 which is adjacent to the trench-type isolating insulation film 50 and closer to the third device formation region. An NMOS transistor is formed in the second device formation region whereas a PMOS transistor is formed in the third device formation region. The isolating insulation film 6 shown in FIG. 1 may be formed on the upper surface of the SOI layer 3 where the well regions 9a and 9b and the trench-type isolating insulation film 50 are formed.

In the structures shown in FIGS. 42 and 43, the isolating insulation film 6 of the first preferred embodiment may be replaced with the isolation structure 20 of the second preferred embodiment, the isolating insulation film 30 of the third preferred embodiment, and the isolating insulation film 40 of the fourth preferred embodiment.

While the invention has been described in detail, the foregoing description is in all aspects illustrative and not restrictive. It is understood that numerous other modifications and variations can be devised without departing from the scope of the invention.

What is claimed is:

1. A method of forming a device isolation structure for providing electrical isolation between first and second semiconductor devices formed respectively in first and second device formation regions of an SOI substrate, said device isolation structure being formed on a device isolation region between said first and second device formation regions of said SOI substrate, said method comprising the steps of:

(a) forming at least a first insulation film and a first film in stacked relation in the order named on a main surface of said SOI substrate;

(b) removing said first film in said first and second device formation regions, but not in the device isolation structure; and (c) removing said first insulation film in said first and second device formation regions, but not in the device isolation structure, by wet etching.

2. The method according to claim 1, wherein said first film comprises a second insulation film different in material from said first insulation film, and wherein said first film is removed by anisotropic dry etching which exhibits a higher etch rate in a direction of the depth of said SOI substrate in said step (b).

3. The method according to claim 2,
wherein said first insulation film is a silicon oxide film, and said second insulation film is a silicon nitride film.

4. The method according to claim 1, wherein said first film comprises a conductive film, and
wherein said step (a) comprises the step of forming a third insulation film on said first film, said method further comprising the step of:
(d) forming a fourth insulation film at a side surface of said first film, said step (d) being performed after said step (c).

5. The method according to claim 4, wherein said third insulation film is a silicon oxide film.

6. The method according to claim 4,
wherein said conductive film is a polysilicon film doped with an impurity, and
wherein said step (d) comprises the steps of:
(d-1) thermally oxidizing a surface of a resultant structure provided in said step (c); and
(d-2) removing a thermal oxide film formed in said step (d-1) by the thermal oxidation of said main surface of said SOI substrate in said first and second device formation regions.

7. The method according to claim 6, further comprising the step of:
(e) forming a sidewall comprising a fifth insulation film on respective side surfaces of said first insulation film, said first film and said third insulation film, said step (e) being performed after said step (d).

8. The method according to claim 7, wherein said step (e) comprises the steps of:
(e-1) forming a sixth insulation film on a resultant structure provided in said step (d);
(e-2) forming a seventh insulation film on said sixth insulation film;
(e-3) performing anisotropic dry etching which exhibits a higher etch rate in a direction of the depth of said SOI substrate on said seventh insulation film by using said sixth insulation film as an etch stopper; and
(e-4) removing said sixth insulation film exposed in said step (e-3) by wet etching.

9. The method according to claim 4, further comprising the step of
(f) exposing said first film to ultraviolet light after all manufacturing steps using plasma.

10. A method of forming a device isolation structure for providing electrical isolation between first and second semiconductor devices formed respectively in first and second device formation regions of an SOI substrate, said device isolation structure being formed on a device isolation region between said first and second device formation regions of said SOI substrate, said method comprising the steps of:

(a) forming a first insulation film on a main surface of said SOI substrate;

(b) removing said first insulation film in said first and second device formation regions by anisotropic dry etching which exhibits a higher etch rate in a direction of the depth of said SOI substrate;

(c) thermally oxidizing said main surface of said SOI substrate exposed in said step (b) to form a thermal oxide film; and (d) removing said thermal oxide film.

11. The method according to claim 10, further comprising the step of
(e) forming a sidewall including a second insulation film on a side surface of said first insulation film in said device isolation region, said step (e) being performed after said step (d).

12. The method according to claim 11,
wherein said step (e) comprises the steps of:
(e-1) forming a third insulation film on a resultant structure provided in said step (d);
(e-2) forming a fourth insulation film on said third insulation film;
(e-3) performing anisotropic dry etching which exhibits a higher etch rate in a direction of the depth of said SOI substrate on said fourth insulation film by using said third insulation film as an etch stopper; and
(e-4) removing said third insulation film exposed in said step (e-3) by wet etching.

13. A method of forming a device isolation structure for providing electrical isolation between first and second semiconductor devices formed respectively in first and second device formation regions of an SOI substrate, said device isolation structure being formed on a device isolation region between said first and second device formation regions of said SOI substrate, said method comprising the steps of:

(a) forming a first film on a main surface of said SOI substrate;

(b) removing said first film in said device isolation region to form a recessed part;

(c) filling said recessed part with a second film serving as an insulation film; and (d) removing said first film in said first and second device formation regions by wet etching.

14. The method according to claim 13, further comprising the step of (e) introducing an impurity into said main surface of said SOI substrate exposed by formation of said recessed part to form a channel stop layer, said step (e) being performed between said steps (b) and (c).

15. The method according to claim 13, wherein said first film is a composite film including a silicon oxide film and a silicon nitride film formed on said silicon oxide film, and said second film is a silicon oxide film.

16. The method according to claim 13, wherein said step (c) comprises the steps of:

(c-1) forming a silicon oxide film on a resultant structure provided in said step (b); and (c-2) polishing a main surface of said silicon oxide until said first film is exposed.

* * * * *